United States Patent
Ohmacht

(10) Patent No.: US 9,733,831 B2
(45) Date of Patent: Aug. 15, 2017

(54) GENERATION-BASED MEMORY SYNCHRONIZATION IN A MULTIPROCESSOR SYSTEM WITH WEAKLY CONSISTENT MEMORY ACCESSES

(71) Applicant: GLOBALFOUNDRIES INC., Grand Cayman (KY)

(72) Inventor: Martin Ohmacht, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 374 days.

(21) Appl. No.: 14/320,841

(22) Filed: Jul. 1, 2014

(65) Prior Publication Data

US 2015/0006840 A1   Jan. 1, 2015

Related U.S. Application Data

(62) Division of application No. 12/796,411, filed on Jun. 8, 2010, now Pat. No. 8,832,403.

(Continued)

(51) Int. Cl.
| | |
|---|---|
| *G06F 3/00* | (2006.01) |
| *G06F 3/06* | (2006.01) |
| *G06F 9/30* | (2006.01) |
| *G06F 9/38* | (2006.01) |
| *G06F 9/52* | (2006.01) |

(Continued)

(52) U.S. Cl.
CPC .......... *G06F 3/0604* (2013.01); *G06F 3/0655* (2013.01); *G06F 3/0671* (2013.01); *G06F 9/3004* (2013.01); *G06F 9/30047* (2013.01); *G06F 9/30087* (2013.01); *G06F 9/3834* (2013.01); *G06F 9/522* (2013.01); *G06F 13/1689* (2013.01); *G06F 2003/0697* (2013.01); *G11C 7/22* (2013.01)

(58) Field of Classification Search
None
See application file for complete search history.

(56) References Cited

U.S. PATENT DOCUMENTS

| | | |
|---|---|---|
| 5,250,943 A | 10/1993 | Childs et al. |
| 5,434,995 A | 7/1995 | Oberlin et al. |

(Continued)

OTHER PUBLICATIONS

Teller, "Translation-Lookaside Buffer Consistency", 1990 IEEE.

(Continued)

*Primary Examiner* — David X Yi
*Assistant Examiner* — Craig Goldschmidt
(74) *Attorney, Agent, or Firm* — Scully Scott Murphy and Presser

(57) ABSTRACT

In a multiprocessor system, a central memory synchronization module coordinates memory synchronization requests responsive to memory access requests in flight, a generation counter, and a reclaim pointer. The central module communicates via point-to-point communication. The module includes a global OR reduce tree for each memory access requesting device, for detecting memory access requests in flight. An interface unit is implemented associated with each processor requesting synchronization. The interface unit includes multiple generation completion detectors. The generation count and reclaim pointer do not pass one another.

8 Claims, 17 Drawing Sheets

Related U.S. Application Data

(60) Provisional application No. 61/295,669, filed on Jan. 15, 2010, provisional application No. 61/293,266, filed on Jan. 8, 2010, provisional application No. 61/293,476, filed on Jan. 8, 2010, provisional application No. 61/293,494, filed on Jan. 8, 2010, provisional application No. 61/293,499, filed on Jan. 8, 2010, provisional application No. 61/293,237, filed on Jan. 8, 2010, provisional application No. 61/293,552, filed on Jan. 8, 2010, provisional application No. 61/293,554, filed on Jan. 8, 2010, provisional application No. 61/293,559, filed on Jan. 8, 2010, provisional application No. 61/293,569, filed on Jan. 8, 2010, provisional application No. 61/293,603, filed on Jan. 8, 2010, provisional application No. 61/293,611, filed on Jan. 8, 2010, provisional application No. 61/261,269, filed on Nov. 13, 2009.

(51) Int. Cl.
*G06F 13/16* (2006.01)
*G11C 7/22* (2006.01)

(56) References Cited

U.S. PATENT DOCUMENTS

| | | | |
|---|---|---|---|
| 5,442,758 A * | 8/1995 | Slingwine | G06F 9/526 707/799 |
| 5,651,124 A | 7/1997 | Shen et al. | |
| 5,742,786 A | 4/1998 | Gallup et al. | |
| 5,893,165 A | 4/1999 | Ebrahim | |
| 5,928,312 A | 7/1999 | Shichiku et al. | |
| 6,098,089 A | 8/2000 | O'Connor et al. | |
| 6,106,575 A | 8/2000 | Hardwick | |
| 6,122,712 A * | 9/2000 | Torii | G06F 12/0828 710/200 |
| 6,233,623 B1 | 5/2001 | Jeffords et al. | |
| 6,253,215 B1 | 6/2001 | Agesen et al. | |
| 6,347,349 B1 | 2/2002 | Neal et al. | |
| 6,629,174 B1 | 9/2003 | Farkas et al. | |
| 6,725,340 B1 | 4/2004 | Guthrie et al. | |
| 7,015,913 B1 | 3/2006 | Lindholm et al. | |
| 7,089,272 B1 | 8/2006 | Garthwaite et al. | |
| 7,302,516 B2 | 11/2007 | Hanaki | |
| 7,788,464 B2 * | 8/2010 | Sheu | G06F 12/1027 711/207 |
| 7,945,911 B1 | 5/2011 | Garthwaite | |
| 2001/0042139 A1 | 11/2001 | Jeffords et al. | |
| 2002/0013889 A1 | 1/2002 | Schuster et al. | |
| 2002/0087849 A1 | 7/2002 | Arimilli et al. | |
| 2003/0088636 A1 | 5/2003 | Nakamura | |
| 2003/0097396 A1 | 5/2003 | Zhang et al. | |
| 2003/0236951 A1 | 12/2003 | Choi et al. | |
| 2004/0193662 A1 | 9/2004 | Garthwaite | |
| 2006/0026309 A1 | 2/2006 | Day et al. | |
| 2006/0059474 A1 | 3/2006 | Bhansali et al. | |
| 2006/0190239 A1 * | 8/2006 | Piper | G06F 17/5081 703/26 |
| 2006/0230087 A1 | 10/2006 | Andreasson | |
| 2008/0140971 A1 | 6/2008 | Dankel et al. | |
| 2008/0294882 A1 | 11/2008 | Jayapala et al. | |
| 2009/0013323 A1 | 1/2009 | May et al. | |
| 2010/0037242 A1 | 2/2010 | Mannarswamy et al. | |

OTHER PUBLICATIONS

IBM® ISATM Version 2.06, Chapter 1. Storage Model, Jan. 30, 2009, pp. 653-667, 700-703 and 717.

Stone et al., "Storage in the PowerPC", IEEE Micro, pp. 50-58, Apr. 1995.

Shao et al., "A Burst Scheduling Access Reordering Mechanism", Department of Electrical and Computer Engineering, Michigan Technological University, High Performance Computer Architecture, 2007, IEEE 13th International Symposium on Feb. 10-14, 2007, pp. 1-10.

Wilson et al., "A "Card-Making" Scheme for Controlling Intergenerational References in Generation-Based Garbage Collection on Stock Hardware", Electrical Engineering and Computer Science Dept., University of Illinois at Chicago, ACM SIGPLAN, vol. 24, Issue 5, May 1989, pp. 87-92.

"Sequential consistency", Wikipedia, last printed Jun. 7, 2010; mhtml:file://I:\IBM\105\24878P\MICS\related%20art\Sequential%20consistency%20-%20Wikiped . . . .

"Write-combining", Wikipedia, last printed Jun. 7, 2010, mhtml:file://I:\IBM\105\24878P\MICS\related/%20art\Write-combining%20consistency%20-%20Wikiped . . . .

"Implicate", Wikipedia, last printed Jun. 7, 2010, mhtml:file://I:\IBM\105\24879\MISC\related%20art\implicate/%20-%20 Wiktionary.mht; pp. 1-2.

"Producer-consumer problem", Wikipedia, last printed Jun. 7, 2010, mhtml:file://I:\IBM\105\24878P\MICS\related art\Prodcuer-consmer problem—Wikipedia, the free encycl . . . , pp. 1-5.

* cited by examiner

MSYNC GENERATION TAGS OF L2 QUEUE ENTRIES
ARE DECODED INTO SINGLE BITS AND OR'D TO
YIELD A BIT VECTOR OF MSYNCS STILL IN FLIGHT

HIGH LEVEL CONNECTIVITY OF GLOBAL GENERATION COUNTER MODULE

GENERATION-BASED MEMORY SYNCHRONIZATION IN A MULTIPROCESSOR SYSTEM WITH WEAKLY CONSISTENT MEMORY ACCESSES

RELATED APPLICATIONS

This application is a divisional of U.S. application Ser. No. 12/796,411, filed Jun. 8, 2010.

The present application claims priority of U.S. provisional application Ser. No. 61/293,266 filed Jan. 8, 2010, which is also incorporated herein by reference. The present application is filed concurrently with a related application entitled "BALANCING WORKLOAD IN A MULTIPROCESSOR SYSTEM RESPONSIVE TO PROGRAMMABLE ADJUSTMENTS IN A SYNCHRONIZATION INSTRUCTION.

Benefit is also claimed of the following, which are also incorporated by reference U.S. Patent Application Ser. Nos. 61/261,269, filed Nov. 13, 2009 for "LOCAL ROLLBACK FOR FAULT-TOLERANCE IN PARALLEL COMPUTING SYSTEMS";

61/293,611, filed Jan. 8, 2010 for "A MULTI-PETASCALE HIGHLY EFFICIENT PARALLEL SUPERCOMPUTER";

61/295,669, filed Jan. 15, 2010 for "SPECULATION AND TRANSACTION IN A SYSTEM SPECULATION AND TRANSACTION SUPPORT IN L2 L1 SUPPORT FOR SPECULATION/TRANSACTIONS IN A2 PHYSICAL ALIASING FOR THREAD LEVEL SPECULATION MULTIFUNCTIONING L2 CACHE CACHING MOST RECENT DIRECTORY LOOK UP AND PARTIAL CACHE LINE SPECULATION SUPPORT", U.S. patent application Ser. No. 12/684,367, filed Jan. 8, 2010, for "USING DMA FOR COPYING PERFORMANCE COUNTER DATA TO MEMORY";

U.S. patent application Ser. No. 12/684,172, filed Jan. 8, 2010, for "HARDWARE SUPPORT FOR COLLECTING PERFORMANCE COUNTERS DIRECTLY TO MEMORY";

U.S. patent application Ser. No. 12/684,190, filed Jan. 8, 2010 for "HARDWARE ENABLED PERFORMANCE COUNTERS WITH SUPPORT FOR OPERATING SYSTEM CONTEXT SWITCHING";

U.S. patent application Ser. No. 12/684,496, filed Jan. 8, 2010 for "HARDWARE SUPPORT FOR SOFTWARE CONTROLLED FAST RECONFIGURATION OF PERFORMANCE COUNTERS";

U.S. patent application Ser. No. 12/684,429, filed Jan. 8, 2010, for "HARDWARE SUPPORT FOR SOFTWARE CONTROLLED FAST MULTIPLEXING OF PERFORMANCE COUNTERS";

U.S. patent application Ser. No. 12/697,799 filed 1 Feb. 2010, for "CONDITIONAL LOAD AND STORE IN A SHARED CACHE";

U.S. patent application Ser. No. 12/684,738, filed Jan. 8, 2010, for "DISTRIBUTED PERFORMANCE COUNTERS";

U.S. patent application Ser. No. 12/684,860, filed Jan. 8, 2010, for "PAUSE PROCESSOR HARDWARE THREAD ON PIN";

U.S. patent application Ser. No. 12/684,174, filed Jan. 8, 2010, for "PRECAST THERMAL INTERFACE ADHESIVE FOR EASY AND REPEATED, SEPARATION AND REMATING";

U.S. patent application Ser. No. 12/684,184, filed Jan. 8, 2010, for "ZONE ROUTING IN A TORUS NETWORK";

U.S. patent application Ser. No. 12/684,852, filed Jan. 8, 2010, for "PROCESSOR RESUME UNIT";

U.S. patent application Ser. No. 12/684,642, filed Jan. 8, 2010, for "TLB EXCLUSION RANGE";

U.S. patent application Ser. No. 12/684,804, filed Jan. 8, 2010, for "DISTRIBUTED TRACE USING CENTRAL PERFORMANCE COUNTER MEMORY";

U.S. patent application Ser. No. 61/293,237, filed Jan. 8, 2010, for "ORDERING OF GUARDED AND UNGUARDED STORES FOR NO-SYNC I/O";

U.S. patent application Ser. No. 12/693,972, filed Jan. 26, 2010, for "DISTRIBUTED PARALLEL MESSAGING FOR MULTIPROCESSOR SYSTEMS";

U.S. patent application Ser. No. 12/688,747, filed Jan. 15, 2010, for "Support for non-locking parallel reception of packets belonging to the same reception FIFO";

U.S. patent application Ser. No. 12/688,773, filed Jan. 15, 2010, for "OPCODE COUNTING FOR PERFORMANCE MEASUREMENT";

U.S. patent application Ser. No. 12/684,776, filed Jan. 8, 2010, for "MULTI-INPUT AND BINARY REPRODUCIBLE, HIGH BANDWIDTH FLOATING POINT ADDER IN A COLLECTIVE NETWORK";

U.S. patent application Ser. No. 61/293,552, filed Jan. 8, 2010, for "LIST BASED PREFETCH";

U.S. patent application Ser. No. 12/684,693, filed Jan. 8, 2010, for "PROGRAMMABLE STREAM PREFETCH WITH RESOURCE OPTIMIZATION";

U.S. patent application Ser. No. 61/293,494, filed Jan. 8, 2010, for "NON-VOLATILE MEMORY FOR CHECKPOINT STORAGE";

U.S. patent application Ser. No. 61/293,476, filed Jan. 8, 2010, for "NETWORK SUPPORT FOR SYSTEM INITIATED CHECKPOINTS";

U.S. patent application Ser. No. 61/293,554, filed Jan. 8, 2010, for "TWO DIFFERENT PREFETCHING COMPLEMENTARY ENGINES OPERATING SIMULTANEOUSLY";

U.S. patent application Ser. No. 12/697,015 filed Jan. 29, 2010, for "DEADLOCK-FREE CLASS ROUTES FOR COLLECTIVE COMMUNICATIONS EMBEDDED IN A MULTI-DIMENSIONAL TORUS NETWORK";

U.S. patent application Ser. No. 61/293,559, filed Jan. 8, 2010, for "IMPROVING RELIABILITY AND PERFORMANCE OF A SYSTEM-ON-A-CHIP BY PREDICTIVE WEAR-OUT BASED ACTIVATION OF FUNCTIONAL COMPONENTS";

U.S. patent application Ser. No. 61/293,569, filed Jan. 8, 2010, for "IMPROVING THE EFFICIENCY OF STATIC CORE TURNOFF IN A SYSTEM-ON-A-CHIP WITH VARIATION";

U.S. patent application Ser. No. 12/697,043 filed Jan. 29, 2010 for "IMPLEMENTING ASYNCHRONOUS COLLECTIVE OPERATIONS IN A MULTI-NODE PROCESSING SYSTEM";

U.S. patent application Ser. No. 12/697,175, Jan. 29, 2010 for "I/O ROUTING IN A MULTIDIMENSIONAL TORUS NETWORK";

U.S. patent application Ser. No. 12/684,287, filed Jan. 8, 2010 for "ARBITRATION IN CROSSBAR INTERCONNECT FOR LOW LATENCY";

U.S. patent application Ser. No. 12/684,630, filed Jan. 8, 2010 for "EAGER PROTOCOL ON A CACHE PIPELINE DATAFLOW";

U.S. patent application Ser. No. 12/723,277 filed Mar. 12, 2010 for "EMBEDDING GLOBAL BARRIER AND COLLECTIVE IN A TORUS NETWORK";

U.S. patent application Ser. No. 61/293,499, filed Jan. 8, 2010 for "GLOBAL SYNCHRONIZATION OF PARALLEL PROCESSORS USING CLOCK PULSE WIDTH MODULATION";

U.S. patent application Ser. No. 12/696,817, filed Jan. 29, 2010, for "HEAP/STACK GUARD PAGES USING A WAKEUP UNIT"; and U.S. patent application Ser. No. 61/293,603, filed Jan. 8, 2010 for "MECHANISM OF SUPPORTING SUB-COMMUNICATOR COLLECTIVES WITH O(64) COUNTERS AS OPPOSED TO ONE COUNTER FOR EACH SUB-COMMUNICATOR".

GOVERNMENT CONTRACT

This invention was made with government support under Contract No. B554331 awarded by the Department of Energy. The Government has certain rights in this invention.

BACKGROUND

The invention relates to the field of synchronizing memory access requests in a multi-processor, parallel computing system with weak consistency.

More about memory synchronization in a multiprocessing system with a weak consistency model can be found in IBM® Power ISA™ Version 2.06 Jan. 30, 2009, e.g. at pp. 653-667, 700-703, and 717. This entire document will also be referred to herein as "PowerPC architecture" or "PPC" and is incorporated by reference. Msync is an instruction type defining ordering requirements for the PowerPC weakly consistent memory model. A core executing an msync is expected to have made all its previously issued writes visible to all cores before any further write may be made visible. The msync instruction is a way of imposing strong or sequential consistency into code that would otherwise be running under the weak consistency model. More about the msync instruction can be found in the article: Janice M. Stone, Robert P. Fitzgerald, "Storage in the PowerPC," IEEE Micro, pp. 50-58, April, 1995.

The invention arose in the context of the IBM® BluGene® system. In prior generations of this system, communication between nodes, including for synchronization purposes, was via broadcast bus. As numbers of nodes have increased with new generations, the demands on the broadcast bus for communication between nodes have become increasingly burdensome.

SUMMARY

It is desirable to implement memory synchronization instructions without synchronization related information burdening data pathways.

Advantageously, a multiprocessor system will include a special memory synchronization unit with point-to-point communication.

It is also desirable to implement a flexible system response to memory synchronization requests.

Advantageously, a multiprocessor system adapted to carry out parallel threads of instructions will include a plurality of units for issuing and/or queuing memory access requests.

The system will further include a central synchronization controller adapted to communicate synchronization control information to and/or from the units via point to point communication rather than via a bus.

Further, advantageously, a multiprocessor system adapted to carry out parallel threads of instructions will include a plurality of units for issuing and queuing memory access requests; and a central synchronization controller adapted to supply a generation tag to the memory access requests.

Moreover, an advantageous method for memory synchronization for use in a multiprocessor system will include carrying out operations in at least one data processing device. The operations will include broadcasting a central generation indication from a memory synchronization unit; and delaying memory access requests responsive to values of the central generation indication In a still further advantageous implementation a central memory synchronization module will include a global generation unit for storing a global numeric generation indication. Also included will be a global or-reduce tree, for aggregating information about current generations of memory requests in flight. Another inclusion will be a broadcast facility for broadcasting the generation indication and a result derived from the tree. This central synchronization module will be for use in a multiprocessor system, including a plurality of processors.

Objects and advantages will be apparent throughout.

BRIEF DESCRIPTION OF THE DRAWING

Embodiments will now be described by way of non-limiting example with reference to the following figures.

FIG. 5 A shows more about the OR tree of FIG. 5.

DETAILED DESCRIPTION

Figure 1:
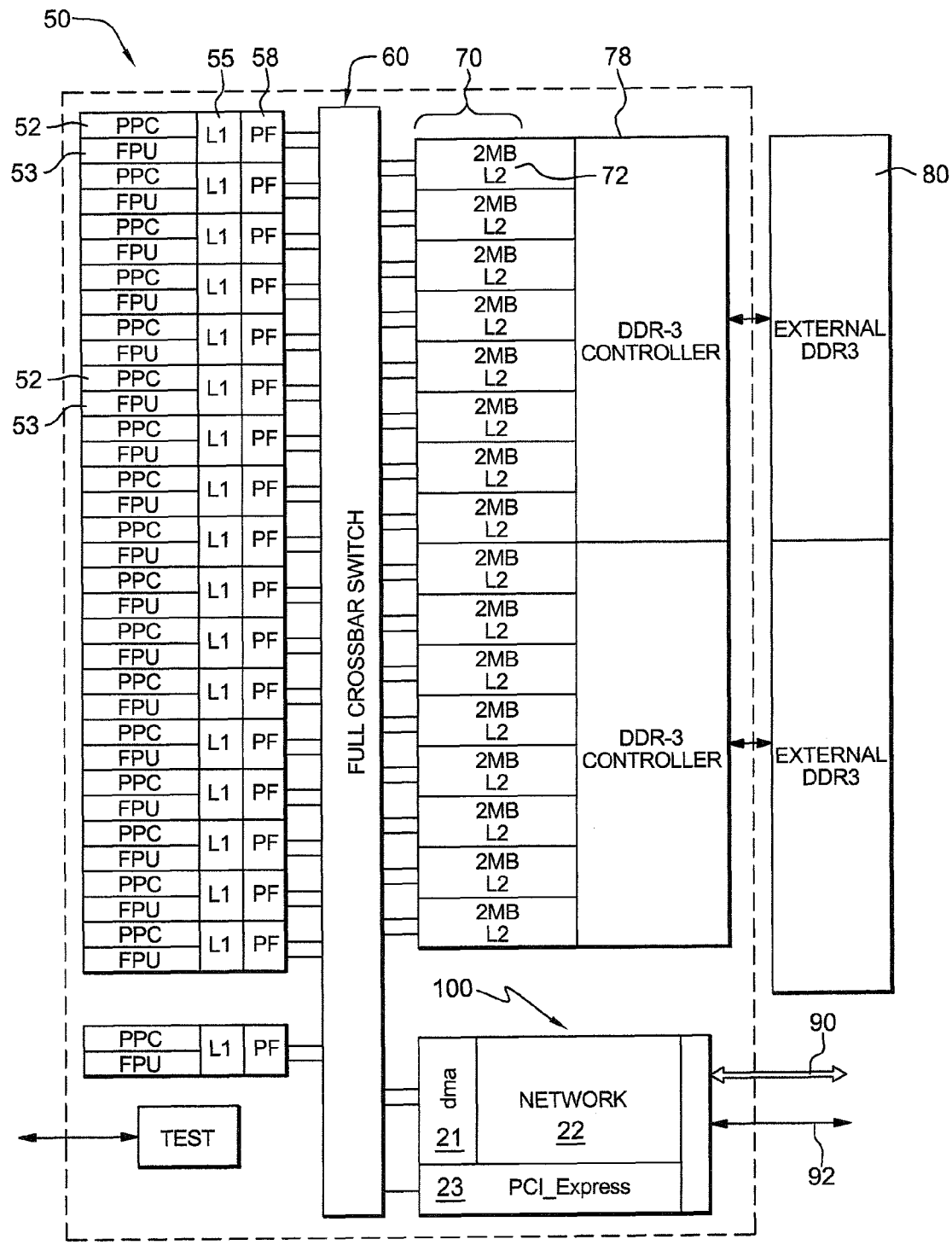
FIG. 1 shows an overview of a multi-processor system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable media may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The present document mentions a number of instruction and function names such as "msync," "hwsync," "lwsync," and "eieio;" "TLBsync," "Mbar," "full sync," "non-cumulative barrier," "producer sync," "generation change sync," "producer generation change sync," "consumer sync," and "local barrier," Some of these names come from the Power PC architecture and others are new to this document, but all are nevertheless arbitrary and for convenience of understanding. An instruction might equally well be given any name as a matter of preference without altering the nature of the instruction or without taking the function instruction or the hardware supporting it outside of the scope of the claims. Moreover the claimed invention is not limited to a particular instruction set.

Generally implementing an instruction will involve creating specific computer hardware that will cause the instruction to run when computer code requests that instruction. The field of Application Specific Integrated Circuits ("ASIC"s) is a well-developed field that allows implementation of computer functions responsive to a formal specification. Accordingly, not all specific implementation details will be discussed here. Instead the functions of instructions and units will be discussed.

As described herein, the use of the letter "B" typically represents a Byte quantity, e.g., 2B, 8.0B, 32B, and 64B represent Byte units. Recitations "GB" represent Gigabyte quantities. Throughout this disclosure a particular embodiment of a multi-processor system will be discussed. This embodiment includes various numerical values for numbers of components, bandwidths of interfaces, memory sizes and the like. These numerical values are not intended to be limiting, but only examples. One of ordinary skill in the art might devise other examples as a matter of design choice.

The term "thread" will be used herein. A thread can be a hardware thread, meaning a processing circuitry within a processor. A thread can also be a software thread, meaning segments of computer program code that are run in parallel, for instance on hardware threads.

General Features of a Multiprocessor System in which the Invention May be Implemented FIG. 1 shows an overall architecture of a multiprocessor computing node 50, a parallel computing system in which the present invention may be implemented. While this example is given as the environment in which the invention of the present application was developed, the invention is not restricted to this environment and might be ported to other environments by the skilled artisan as a matter of design choice.

The compute node 50 is a single chip ("nodechip") is based on low power A2 PowerPC cores, though any compatible core might be used. While the commercial embodiment is built around the PowerPC architecture, the invention is not limited to that architecture. In the embodiment depicted, the node includes 17 cores 52, each core being 4-way hardware threaded. There is a shared L2 cache 70 accessible via a full crossbar switch 60, the L2 including 16 slices 72. There is further provided external memory 80, in communication with the L2 via DDR-3 controllers 78—DDR being an acronym for Double Data Rate.

A messaging unit ("MU") 100 includes a direct memory access ("DMA") engine 21, a network interface 22, a Peripheral Component Interconnect Express ("PCIe") unit 32. The MU is coupled to interprocessor links 90 and i/o link 92.

Figure 9:
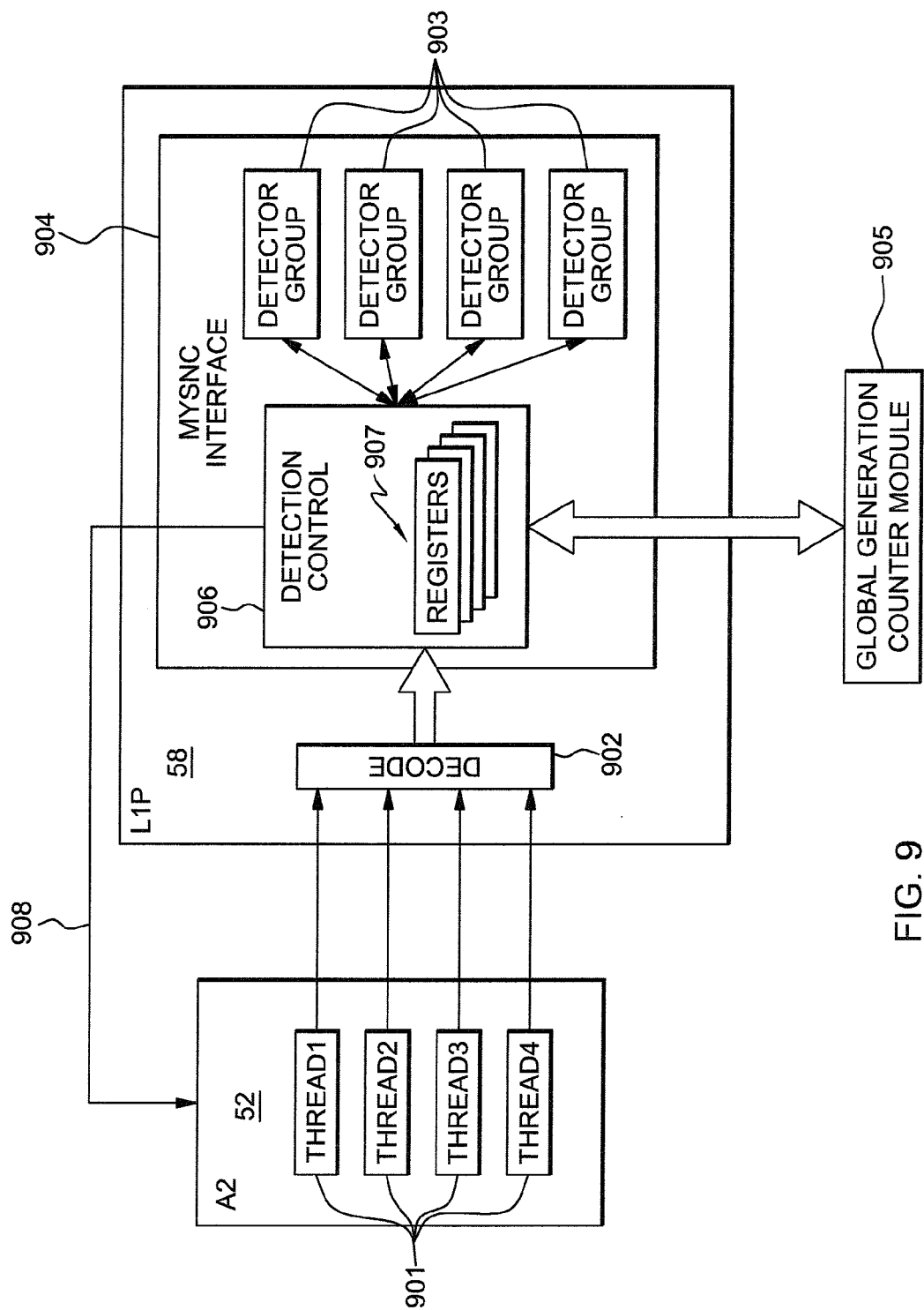
FIG. 9 is a conceptual diagram showing operation of a memory synchronization interface unit.
Figure 15:
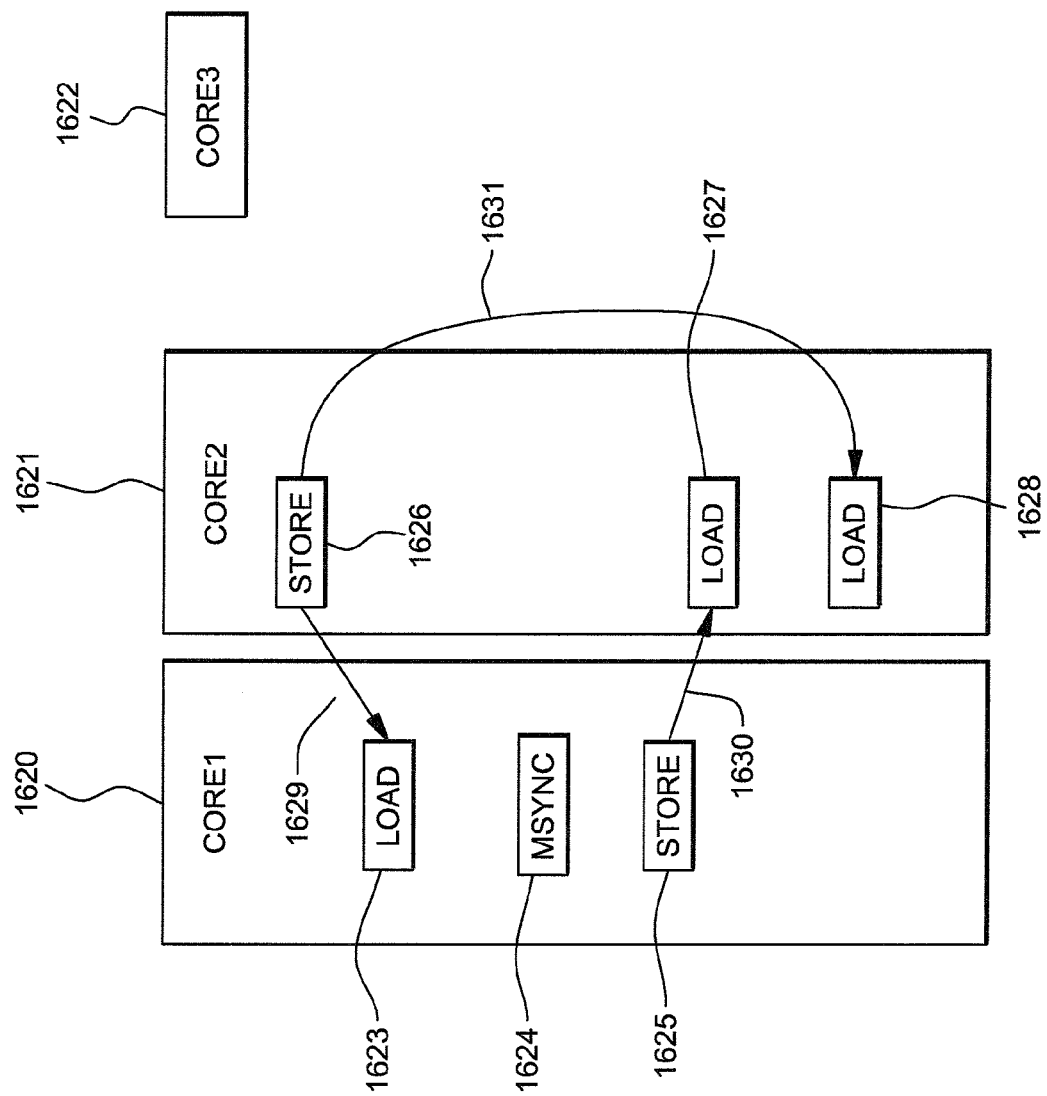
FIG. 15 illustrates ordering constraints in threads running in parallel.

Each FPU 53 associated with a core 52 has a data path to the L1-data cache 55. Each core 52 is directly connected to a supplementary processing agglomeration 58, which includes a private prefetch unit. For convenience, this agglomeration 58 will be referred to herein as "L1P"—meaning level 1 prefetch—or "prefetch unit;" but many additional functions are lumped together in this so-called prefetch unit, such as write combining. These additional functions could be illustrated as separate modules, but as a matter of drawing and nomenclature convenience the additional functions and the prefetch unit will be illustrated herein as being part of the agglomeration labeled "L1P." This is a matter of drawing organization, not of substance. Some of the additional processing power of this L1P group is shown in FIGS. 9 and 15. The L1P group also accepts, decodes and dispatches all requests sent out by the core 52.

In this embodiment, the L2 Cache units provide the bulk of the memory system caching. Main memory may be accessed through two on-chip DDR-3 SDRAM memory controllers 78, each of which services eight L2 slices.

To reduce main memory accesses, the L2 advantageously serves as the point of coherence for all processors within a nodechip. This function includes generating L1 invalidations when necessary. Because the L2 cache is inclusive of the L1s, it can remember which processors could possibly have a valid copy of every line, and can multicast selective invalidations to such processors. In the current embodiment the prefetch units and data caches can be considered part of a memory access pathway.

Figure 2:
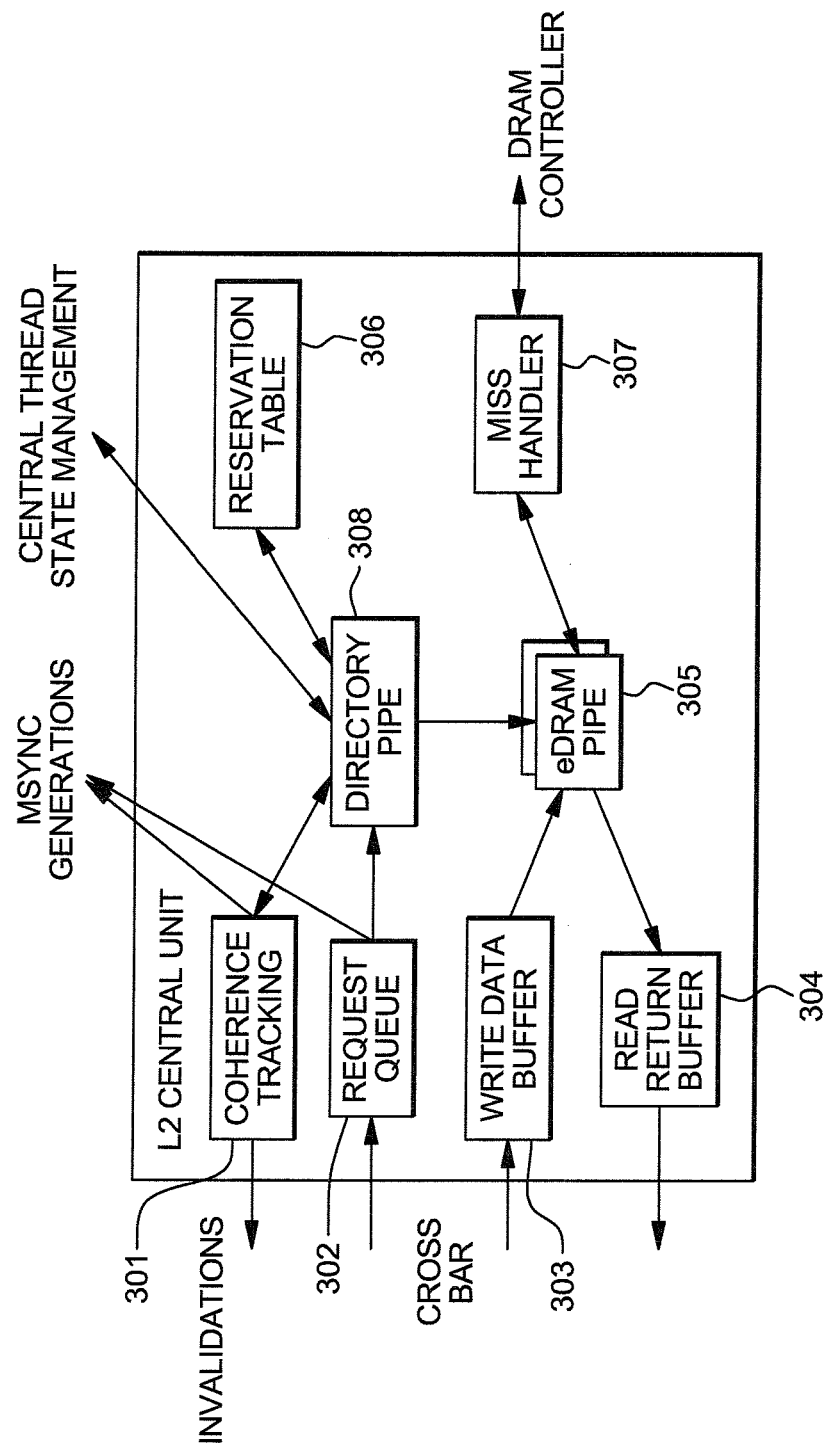
FIG. 2 shows the control portion of an L2 slice.

FIG. 2 shows features of the control portion of an L2 slice. Broadly, this unit includes coherence tracking at 301, a request queue at 302, a write data buffer at 303, a read return buffer at 304, a directory pipe 308, EDRAM pipes 305, a reservation table 306, and a DRAM controller. The functions of these elements are explained in more detail in U.S. provisional patent application Ser. No. 61/299,911 filed Jan. 29, 2010, which is incorporated herein by reference.

The units 301 and 302 have outputs relevant to memory synchronization, as will be discussed further below with reference to FIG. 5B.

Figure 3A:
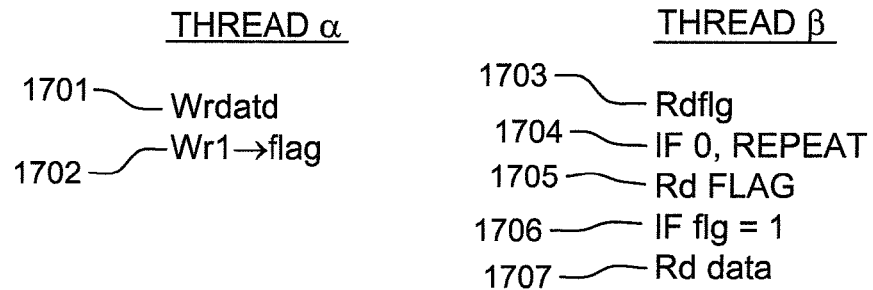
FIG. 3A shows a producer thread and a consumer thread.

FIG. 3A shows a simple example of a producer thread α and a consumer thread β. In this example, α seeks to do a double word write 1701. After the write is finished, it sets a 1 bit flag 1702, also known as a guard location. In parallel, β reads the flag 1703. If the flag is zero, it keeps reading 1704. If the flag is not zero, it again reads the flag 1705. If the flag is one, it reads data written by α.

Figure 4:
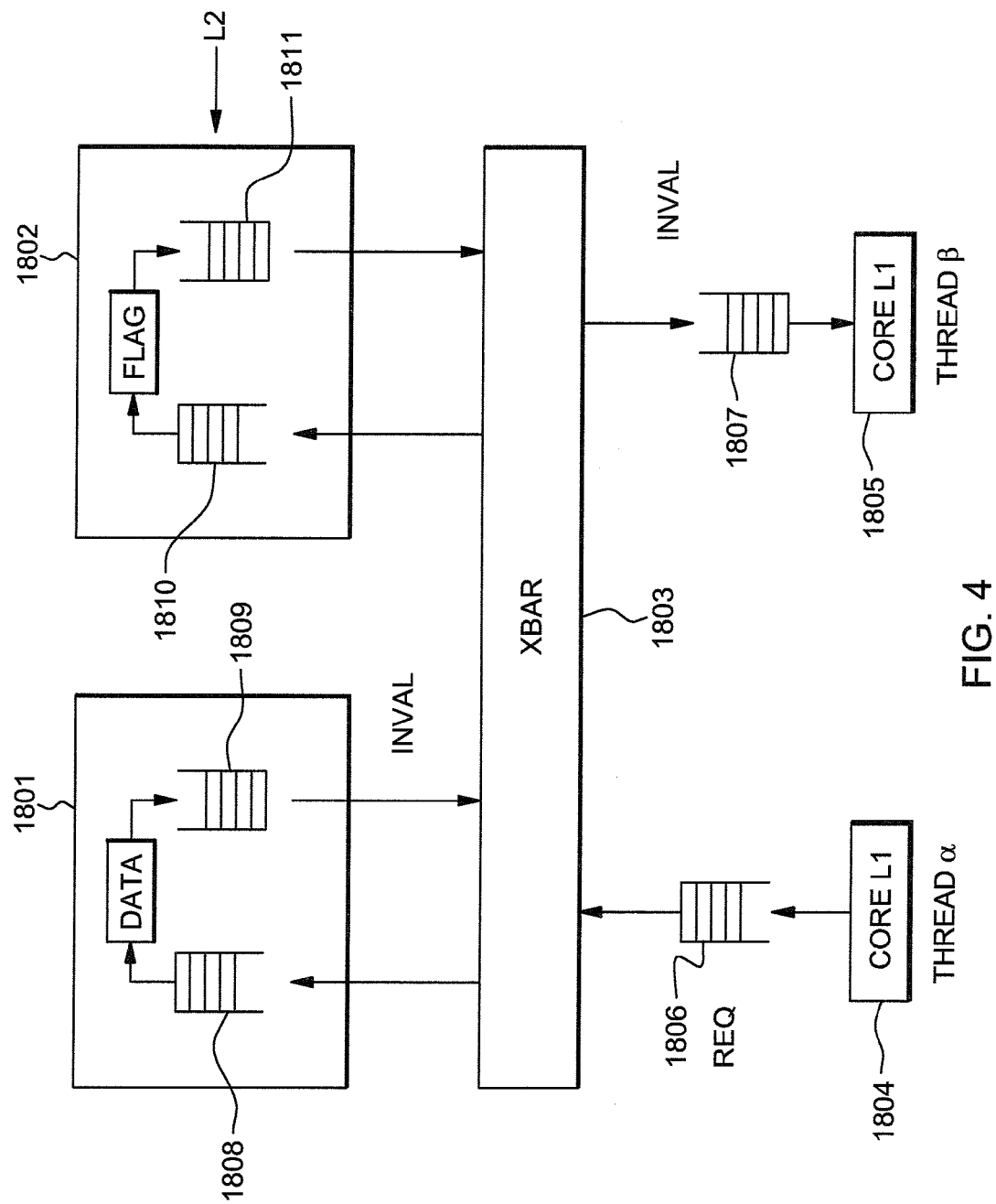
FIG. 4 shows what happens in the system in response to the instructions of FIG. 3A.

FIG. 4 shows conceptually where delays in the system can cause problems with this exchange. Thread α is running on a first core/L1 group 1804. Thread β is running on a second core/L1 group 1805. Both of these groups will have a copy of the data and flag relating to the thread in their L1D caches. When α does the data write, it queues a memory access request at 1806, which passes through the crossbar switch 1803 and is hashed to a first slice 1801 of the L2, where it is also queued at 1808 and eventually stored.

The L2, as point of coherence, detects that the copy of the data resident in the L1D for thread β is invalid. Slice 1801 therefore queues an invalidation signal to the queue 1809 and then, via the crossbar switch, to the queue 1807 of core/L1 group 1805.

When α writes the flag, this again passes through queue 1806 to the crossbar switch 1803, but this time the write is hashed to the queue 1810 of a second slice 1802 of the L2. This flag is then stored in the slice and queued at 1811 to go to through the crossbar 1803 to queue 1807 and then to the core/L1 group 1805. In parallel, thread β, is repeatedly scanning the flag in its own L1D.

Traditionally, multiprocessor systems have used consistency models called "sequential consistency" or "strong consistency", see e.g. the article entitled "Sequential Consistency" in Wikipedia. Pursuant to this type of model, if unit 1804 first writes data and then writes the flag, this implies that if the flag has changed, then the data has also changed. It is not possible for the flag to be changed before the data. The data change must be visible to the other threads before the flag changes. This sequential model has the disadvantage that threads are kept waiting, sometimes unnecessarily, slowing processing.

To speed processing, PowerPC architecture uses a "weakly consistent" memory model. In that model, there is no guarantee whatsoever what memory access request will first result in a change visible to all threads. It is possible that β will see the flag changing, and still not have received the invalidation message from slice 1801, so β may still have old data in its L1D.

Figure 3B:
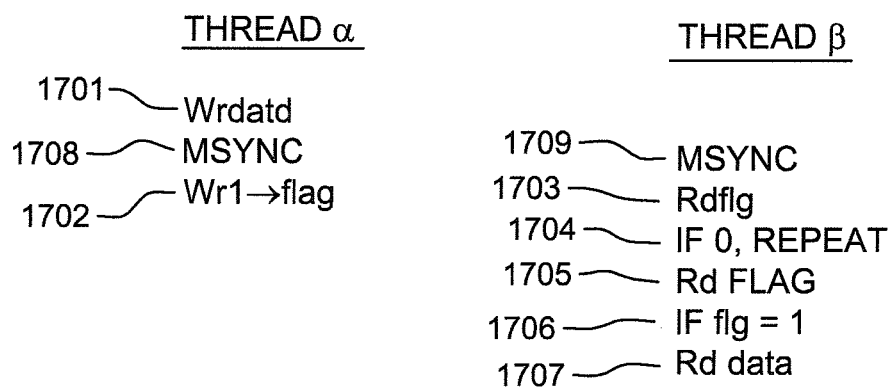
FIG. 3B shows the threads of FIG. 3A with an MSYNC instruction added.

To prevent this unfortunate result, the PowerPC programmer can insert msync instructions 1708 and 1709 as shown in FIG. 3B. This will force a full sync, or strong consistency, on these two threads, with respect to this particular data exchange. In PowerPC architecture, if a core executes an msync, it means that all the writes that have happened before the msync are visible to all the other cores before any of the memory operations that happened after the msync will be seen. In other words, at the point of time when the msync completes, all the threads will see the new write data. Then the flag change is allowed to happen. In other words, until the invalidation goes back to group 1805, the flag cannot be set.

In accordance with the embodiment disclosed herein, to support concurrent memory synchronization instructions, requests are tagged with a global "generation" number. The generation number is provided by a central generation counter. A core executing a memory synchronization requests the central unit to increment the generation counter and then waits until all memory operations of the previously current generation and all earlier generations have completed.

A core's memory synchronization request is complete when all requests that were in flight when the request began have completed. In order to determine this, the L1P monitors a reclaim pointer that will be discussed further below. Once it sees the reclaim pointer moving past the generation that was active at the point of the start of the memory synchronization request, then the memory synchronization request is complete.

Figure 5:
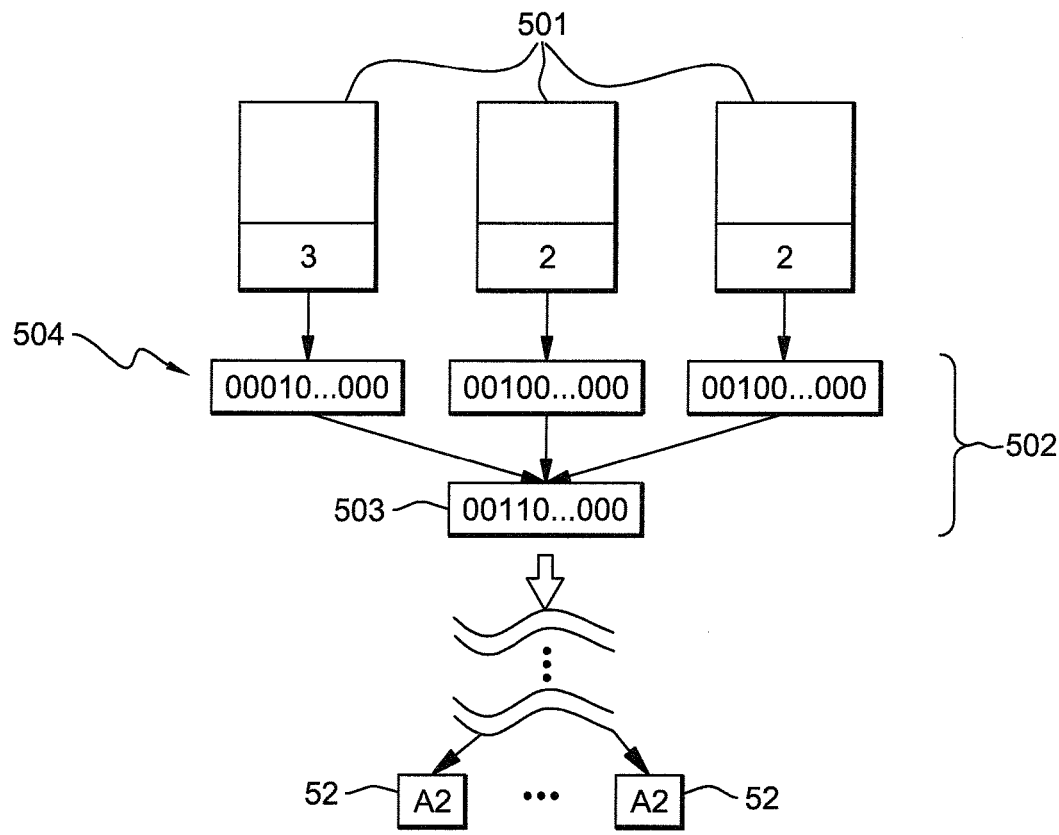
FIG. 5 shows conceptually the operation of an OR reduce tree for communicating generation usage from devices requesting memory accesses.
Figure 5A:
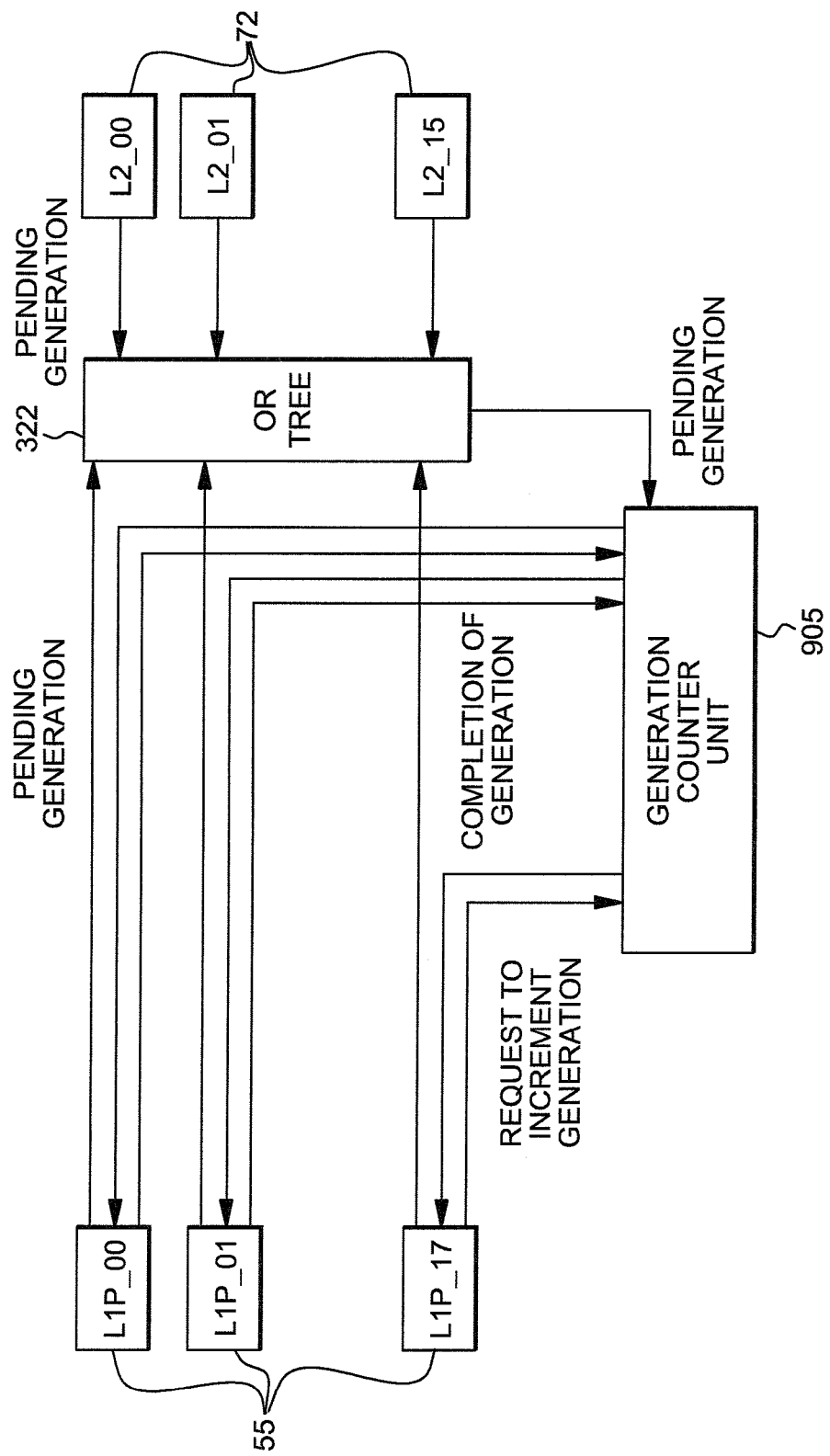
FIG. 5B shows creation of a vector within a unit processing memory access requests.

FIG. 5A shows a view of the memory synchronization central unit. In the current embodiment, the memory synchronization generation counter unit 905 is a discrete unit placed relatively centrally in the chip 50, close to the crossbar switch 60. It has a central location as it needs short distances to a lot of units. L1P units request generation increments, indicate generations in flight, and receive indications of generations completed. The L2's provide indications of generations in flight. The OR-tree 322 receives indications of generations in flight from all units queuing memory access requests, Tree 322 is a distributed structure. Its parts are scattered across the entire chip, coupled with the units that are queuing the memory access requests. The components of the OR reduce tree are a few OR gates at every fork of the tree. These gates are not inside any unit. Another view of the OR reduce tree is discussed with respect to FIG. 5, below.

A number of units within the nodechip queue memory access requests, these include:
L1P
L2
DMA
PCIe Every such unit can contain some aspect of a memory access request in flight that might be impacted by a memory synchronization request. FIG. 5B shows an abstracted view of one of these units at 1201, a generic unit that issues or processes memory requests via a queue. Each such unit includes a queue 1202 for receiving and storing memory requests. Each position in the queue includes bits 1203 for storing a tag that is a three bit generation number. Each of the sets of three bits is coupled to a three-to-eight binary decoder 1204. The outputs of the binary decoders are OR-ed bitwise at 1205 to yield the eight bit output vector 1206, which then feeds the OR-reduce tree of FIG. 5. A clear bit in the output vector means that no request associated with that generation is in flight. Core queues are flushed prior to the start of the memory synchronization request and therefore do not need to be tagged with generations. The L1D need not queue requests and therefore may not need to have the unit of FIG. 5B

Figure 5B:
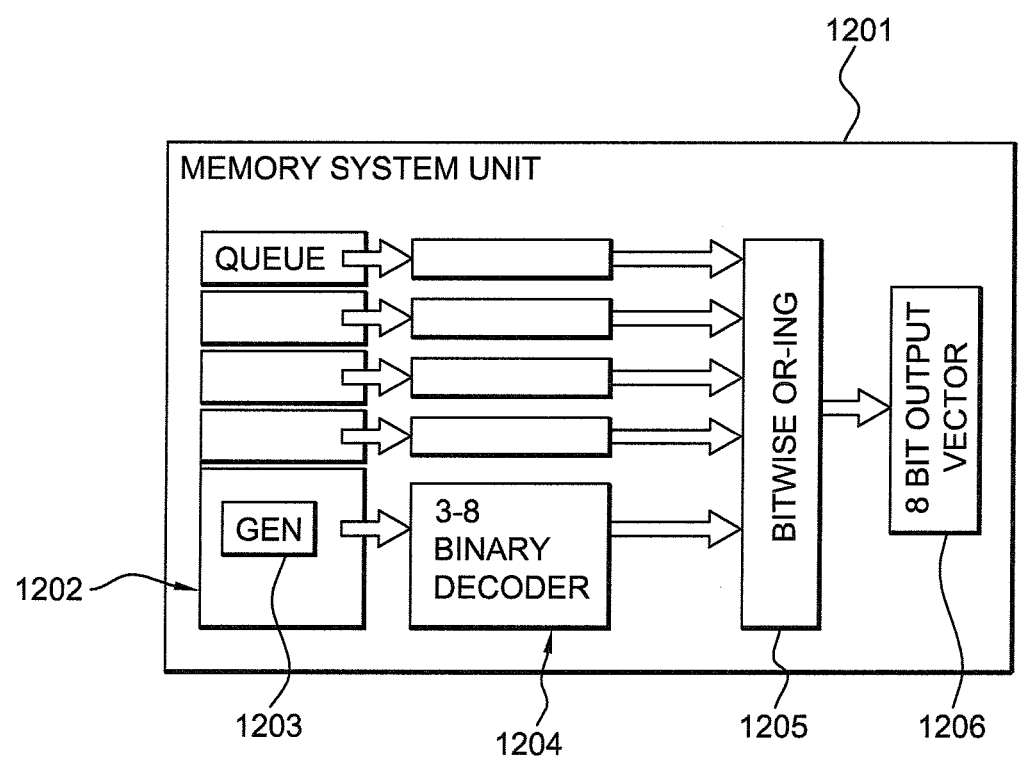

The global OR tree 502 per FIG. 5 receives—from all units 501 issuing and queuing memory requests—an eight bit wide vector 504, per FIG. 5B at 1206. Each bit of the vector indicates for one of the eight generations whether this unit is currently holding any request associated with that generation. The numbers 3, 2, and 2 in units 501 indicate that a particular generation number is in flight in the respective unit. This generation number is shown as a bit within vectors 502. While the present embodiment has 8 bit vectors, more or less bits might be used by the designer as needed for particular applications. FIG. 5 actually shows these vectors as having more than eight bits, based on the ellipsis and trailing zeroes. This is an alternative embodiment. The Global OR tree reduces each bit of the vector individually, creating one resulting eight bit wide vector 503, each bit of which indicates if any request of the associated generation is in flight anywhere in the node. This result is sent to the global generation counter 905 and thence broadcasted to all core units 52, as shown in FIG. 5 and also at 604 of FIG. 6. FIG. 5 is a simplified figure. The actual OR gates are not shown and there would, in the preferred embodiment, be many more than three units contributing to the OR reduce tree.

Because the memory subsystem has paths—especially the crossbar—through which requests pass without contributing to the global OR reduce tree of FIG. 5, the memory synchronization exit condition is a bit more involved. All such paths have a limited, fixed delay after which requests are handed over to a unit 501 that contributes to the global OR. Compensating for such delays can be done in several alternative ways. For instance, if the crossbar has a delay of six cycles, the central unit can wait six cycles after disappearance of a bit from the OR reduce tree, before concluding that the generation is no longer in flight. Alternatively, the L1P might keep the bit for that generation turned on during the anticipated delay.

Memory access requests tagged with a generation number may be of many types, including:
A store request; including compound operations and "atomic" operations such as store-add requests
A load request, including compound and "atomic" operations such as load-and-increment requests
An L1 data cache ("L1D") cache invalidate request created in response to any request above
An Instruction Cache Block Invalidate instruction from a core 52 ("ICBI", a PowerPC instruction);
An L1 Instruction Cache ("L1I") cache invalidate request created in response to a ICBI request
A Data Cache Block Invalidate instruction from a core 52 ("DCBI", a PowerPC instruction);
An L1I cache invalidate request created in response to a DCBI request Memory Synchronization Unit The memory synchronization unit 905 shown in FIG. 6 allows grouping of memory accesses into generations and enables ordering by providing feedback when a generation of accesses has completed. The following functions are implemented in FIG. 6:
A 3 bit counter 601 that defines the current generation for memory accesses;
A 3 bit reclaim pointer 602 that points to the oldest generation in flight;
Privileged DCR access 603 to all registers defining the current status of the generation counter unit. The DCR bus is a maintenance bus that allows the cores to monitor status of other units. In the current embodiment, the cores do not access the broadcast bus 604. Instead they monitor the counter 601 and the pointer 602 via the DCR bus;
A broadcast interface 604 that provides the value of the current generation counter and the reclaim pointer to all memory request generating units. This allows threads to tag all memory accesses with a current generation, whether or not a memory synchronization instruction appears in the code of that thread;
A request interface 605 for all synchronization operation requesting units;
A track and control unit 606, for controlling increments to 601 and 602.

In the current embodiment, the generation counter is used to determine whether a requested generation change is complete, while the reclaim pointer is used to infer what generation has completed.

Figure 6:
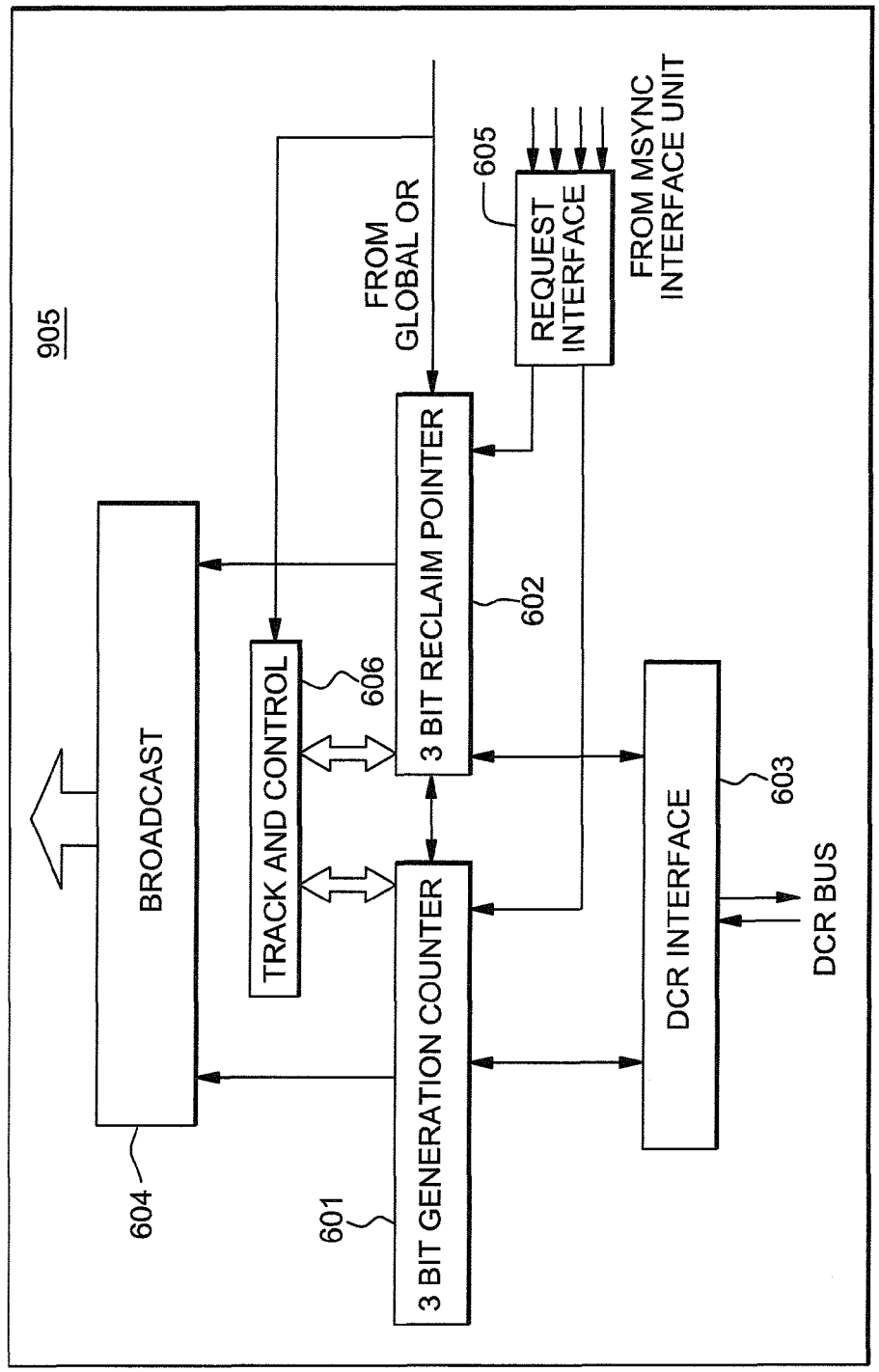
FIG. 6 shows a central msync unit.

The module 905 of FIG. 6 broadcasts via 604 a signal defining the current generation number to all memory synchronization interface units, which in turn tag their accesses with that number. Each memory subsystem unit that may hold such tagged requests flags per FIG. 5B for each generation whether it holds requests for that particular generation or not.

For a synchronization operation, a unit can request an increment of the current generation and wait for previous generations to complete.

The central generation counter uses a single counter 601 to determine the next generation. As this counter is narrow, for instance 3 bits wide, it wraps frequently, causing the reuse of generation numbers. To prevent using a number that is still in flight, there is a second, reclaiming counter 602 of identical width that points to the oldest generation in flight. This counter is controlled by a track and control unit 606 implemented within the memory synchronization unit. Signals from the msync interface unit, discussed with reference to FIGS. 9 and 10 below, are received at 605. These include requests for generation change.

Figure 7:
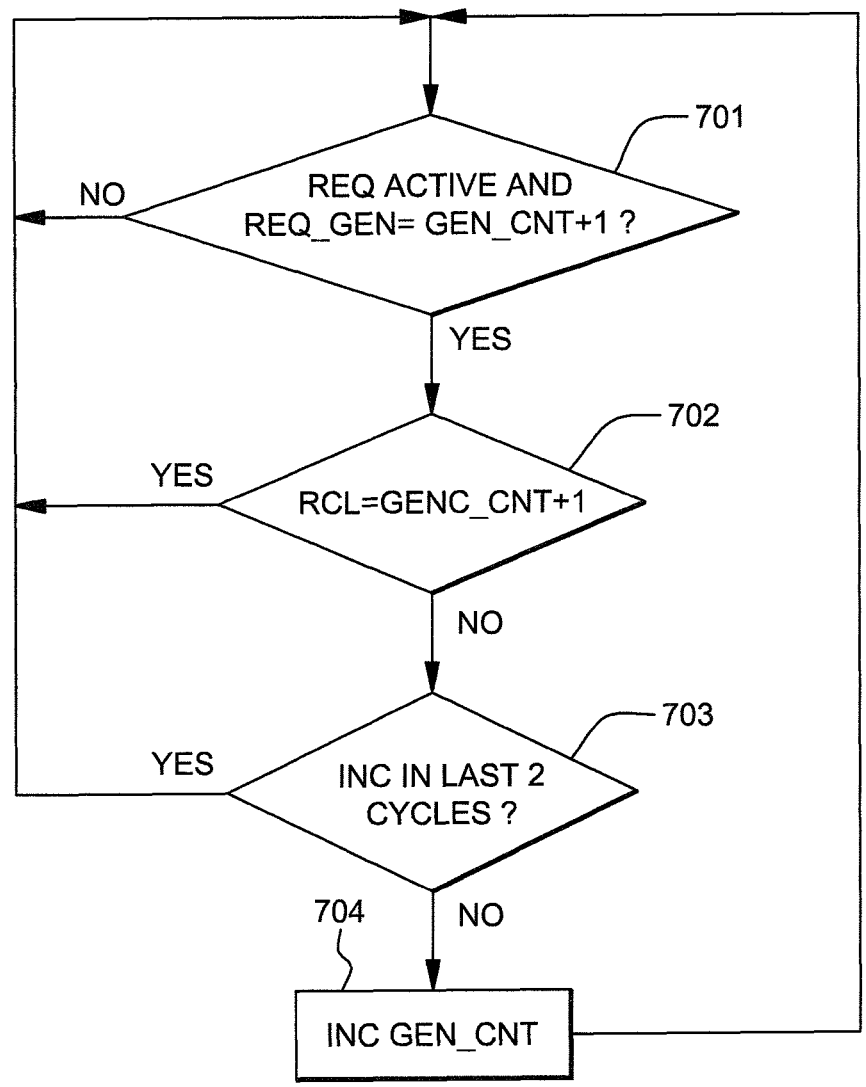
FIG. 7 is a flowchart relating to use of a generation counter and a reclaim pointer.

FIG. 7 illustrates conditions under which the generation counter may be incremented and is part of the function of the track and control unit 606. At 701 it is tested whether a request to increment is active and the request specifies the current value of the generation counter plus one. If not, the unit must wait at 701. If so, the unit tests at 702 whether the reclaim pointer is equal to the current generation pointer plus one. If so, again the unit must wait and retest in accordance with 701. If not, it is tested at 703 whether the generation counter has been incremented in the last two cycles, if so, the unit must wait at 701. If not, the generation counter may be incremented at 704.

The generation counter can only advance if doing so would not cause it to point to the same generation as the reclaim pointer per in the next cycle. If the generation counter is stalled by this condition, it can still receive incoming memory synchronization requests from other cores and process them all at once by broadcasting the identical grant to all of them, causing them all to wait for the same generations to clear. For instance, all requests for generation change from the hardware threads can be OR'd together to create a single generation change request.

The generation counter (gen_cnt) 601 and the reclaim pointer (rcl_ptr) 602 both start at zero after reset. When a unit requests to advance to a new generation, it indicates the desired generation. There is no request explicit acknowledge sent back to the requestor, the requestor unit determines at whether its request has been processed based on the global current generation 601, 602. As the requested generation can be at most the gen_cnt+1, requests for any other generation at are assumed to have already been completed.

If the requested generation is equal to gen_cnt+1 and equal to rcl_ptr at, an increment is requested because the next generation value is still in use. The gen_cnt will be incremented as soon as the rcl_ptr increments.

If the requested generation is not equal to gen_cnt+1, it is assumed completed and is ignored.

If the requested generation is equal to gen_cnt+1 and not equal to rcl_ptr, gen_cnt is incremented at; but gen_cnt is incremented at most every 2 cycles, allowing units tracking the broadcast to see increments even in the presence of single cycle upset events.

Figure 8:
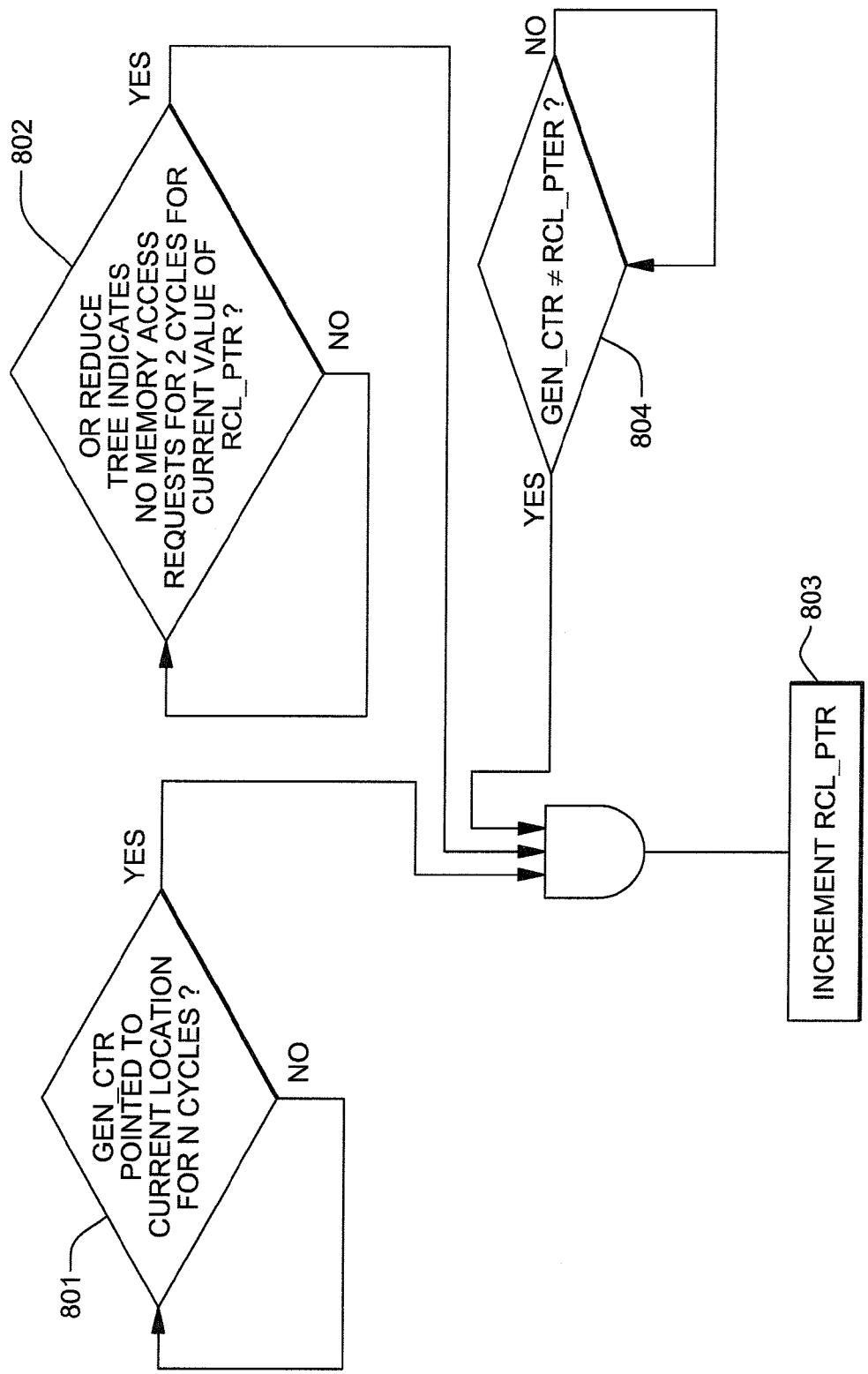
FIG. 8 is a flow chart relating to update of a reclaim pointer.

Per FIG. 8, which is implemented in box 606, the reclaim counter is advanced at 803 if Per 804 it is not identical to the generation counter;

per 801, the gen_cnt has pointed to its current location for at least n cycles. The variable n is defined by the generation counter broadcast and OR-reduction turn-around latency plus 2 cycles to remove the influence of transient errors on this path; and Per 803, the OR reduce tree has indicated for at least 2 cycles that no memory access requests are in flight for the generation rcl_ptr points to. In other words, in the present embodiment, the incrementation of the reclaim pointer is an indication to the other units that the requested generation has completed. Normally, this is a requirement for a "full sync" as described below and also a requirement for the PPC msync.

Levels of Synchronization

The PowerPC architecture defines three levels of synchronization:

heavy-weight sync, also called hwsync, or msync, lwsync (lightweight sync) and eieio (also called mbar, memory barrier).

Generally it has been found that programmers overuse the heavyweight sync in their zealousness to prevent memory inconsistencies. This results in unnecessary slowing of processing. For instance, if a program contains one data producer and many data consumers, the producer is the bottleneck. Having the producer wait to synchronize aggravates this. Analogously, if a program contains many producers and only one consumer, then the consumer can be the bottleneck and forcing it to wait should be avoided where possible.

In implementing memory synchronization, it has been found advantageous to offer several levels of synchronization programmable by memory mapped I/O. These levels can be chosen by the programmer in accordance with anticipated work distribution. Generally, these levels will be most commonly used by the operating system to distribute workload. It will be up to the programmer choosing the level of synchronization to verify that different threads using the same data have compatible synchronization levels.

Figure 12:
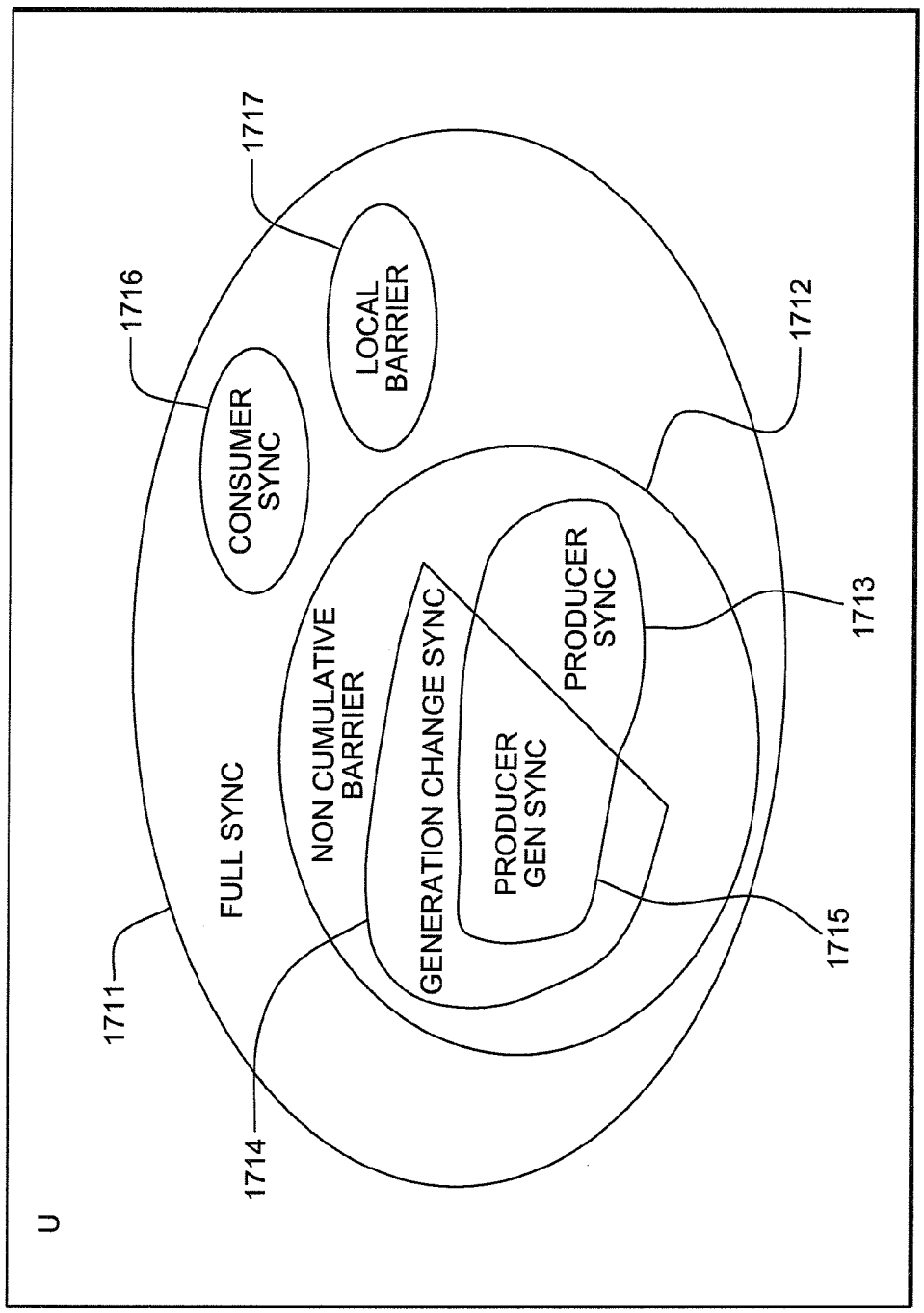
FIG. 12 shows a Venn diagram with different levels of msync.

Seven levels or "flavors" of synchronization operations are discussed herein. These flavors can be implemented as alternatives to the msync/hwsync, lwsync, and mbar/eieio instructions of the PowerPC architecture. In this case, program instances of these categories of Power PC instruction can all be mapped to the strongest sync, the msync, with the alternative levels then being available by memory-mapped i/o. The scope of restrictions imposed by these different flavors is illustrated conceptually in the Venn diagram of FIG. 12. While seven flavors of synchronization are disclosed herein, one of ordinary skill in the art might choose to implement more or less flavors as a matter of design choice. In the present embodiment, these flavors are implemented as a store to a configuration address that defines how the next msync is supposed to be interpreted.

The seven flavors disclosed herein are:

Full Sync 1711

The full sync provides sufficient synchronization to satisfy the requirements of all PowerPC msync, hwsync/lwsync and mbar instructions. It causes the generation counter to be incremented regardless of the generation of the requestor's last access. The requestor waits until all requests complete that were issued before its generation increment request. This sync has sufficient strength to implement the PowerPC synchronizing instructions.

Non-Cumulative Barrier 1712
  This sync ensures that the generation of the last access of the requestor has completed before the requestor can proceed. This sync is not strong enough to provide cumulative ordering as required by the PowerPC synchronizing instructions. The last load issued by this processor may have received a value written by a store request of another core from the subsequent generation. Thus this sync does not guarantee that the value it saw prior to the store is visible to all cores after this sync operation. More about the distinction between non-cumulative barrier and full sync is illustrated by FIG. 15. In this figure there are three core processors 1620, 1621, and 1622. The first processor 1620 is running a program that includes three sequential instructions: a load 1623, an msync 1624, and a store 1625. The second processor 1621 is running a second set of sequential instructions: a store 1626, a load 1627, and a load 1628. It is desired for
  a) the store 1626 to precede the load 1623 per arrow 1629;
  b) the store 1625 to precede the load 1627 per arrow 1630, and
  c) the store 1626 to precede the load 1628 per arrow 1631.
  The full sync, which corresponds to the PowerPC msync instruction, will guarantee the correctness of order of all three arrows 1629, 1630, and 1631. The non-cumulative barrier will only guarantee the correctness of arrows 1629 and 1630. If, on the other hand, the program does not require the order shown by arrow 1631, then the non-cumulative barrier will speed processing without compromising data integrity.

Producer Sync 1713
  This sync ensures that the generation of the last store access before the sync instruction of the requestor has completed before the requestor can proceed. This sync is sufficient to separate the data location updates from the guard location update for the producer in a producer/consumer queue. This type of sync is useful where the consumer is the bottleneck and where there are instructions that can be carried out between the memory access and the msync that do not require synchronization. It is also not strong enough to provide cumulative ordering as required by the PowerPC synchronizing instructions.

Generation Change Sync 1714
  This sync ensures only that the requests following the sync are in a different generation than the last request issued by the requestor. This type of sync is normally requested by the consumer and puts the burden of synchronization on the producer. This guarantees that load and stores are completed. This might be particularly useful in the case of atomic operations as defined in application 61/299,911 filed Jan. 29, 2010, which is incorporated herein by reference, and where it is desired to verify that all data is consumed.

Producer Generation Change Sync 1715
  This sync is designed to slow the producer the least. This sync ensures only that the requests following the sync are in a different generation from the last store request issued by the requestor. This can be used to separate the data location updates from the guard location update for the producer in a producer/consumer queue. However, the consumer has to ensure that the data location updates have completed after it sees the guard location change. This type does not require the producer to wait until all the invalidations are finished. The term "guard location" here refers to the type of data shown in the flag of FIGS. 3A and 3B. Accordingly, this type might be useful for the types of threads illustrated in those figures. In this case the consumer has to know that the flag being set does not mean that the data is ready. If the flag has been stored with generation X, the data has been stored with x−1 or earlier. The consumer just has to make sure that the current generation−1 has completed.

Consumer Sync 1716
  This request is run by the consumer thread. This sync ensures that all requests belonging to the current generation minus one have completed before the requestor can proceed. This sync can be used by the consumer in conjunction with a producer generation change sync by the producer in a producer/consumer queue.

Local Barrier 1717
  This sync is local to a core/L1 group and only ensures that all its preceding memory accesses have been sent to the switch.

Figure 11:
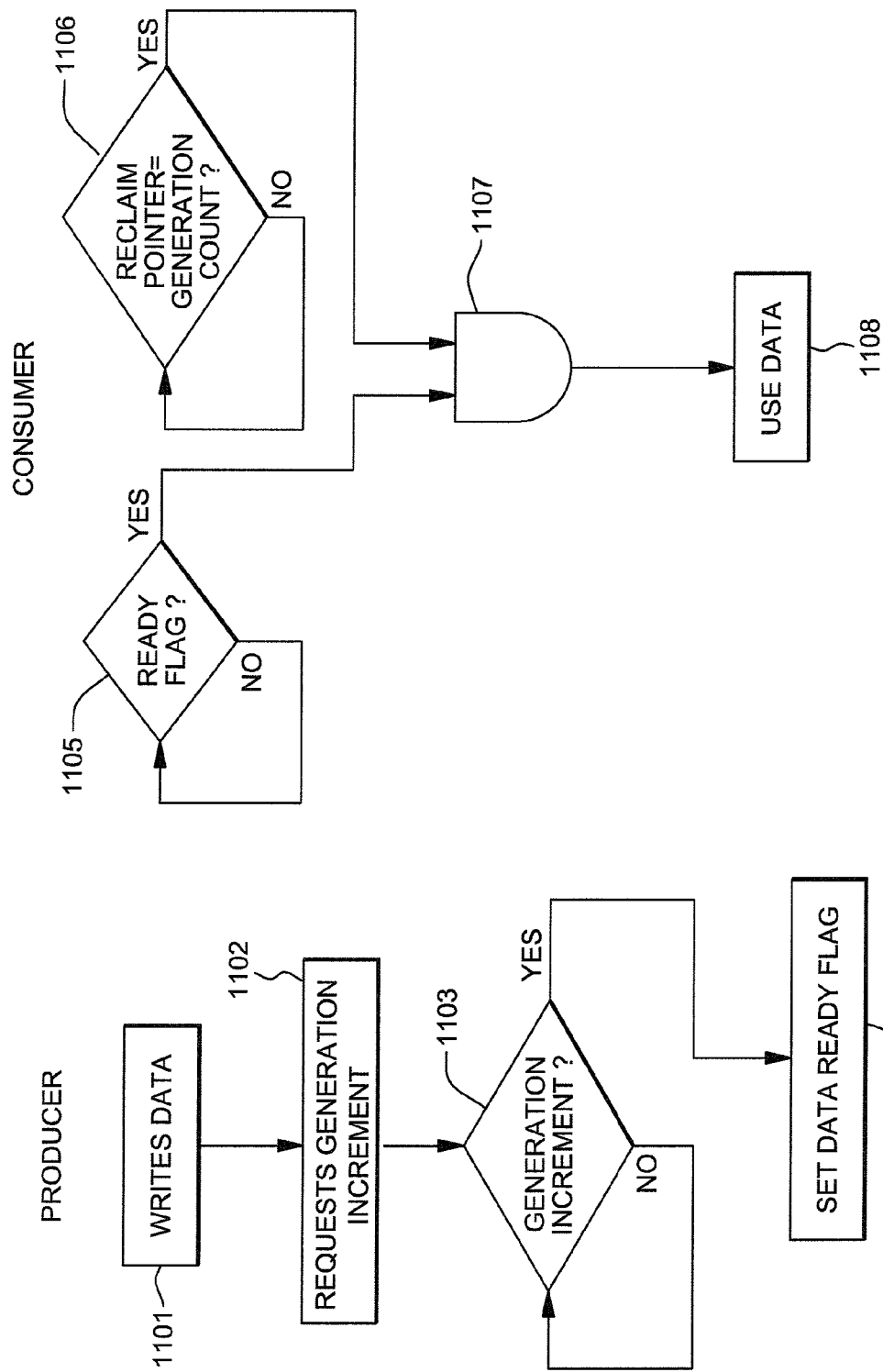
FIG. 11 shows flowcharts relating to how data producer and consumer threads communicate via the memory synchronization interface to determine when data is ready for exchange between threads.
Figure 14:
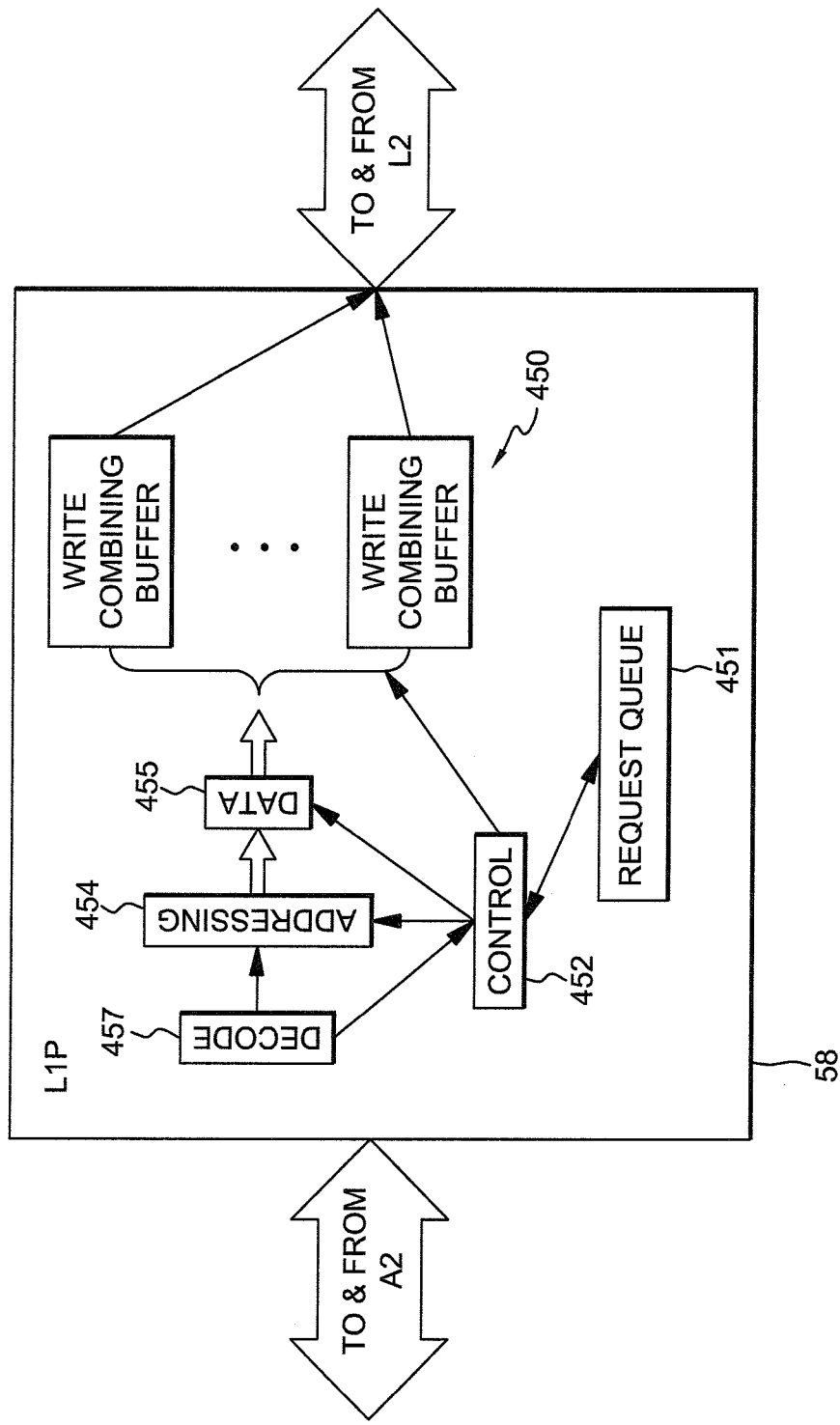
FIG. 14 shows some circuitry within the L1P.

FIG. 11 shows how the threads of FIG. 3B can use the generation counter and reclaim pointer to achieve synchronization without a full sync. At 1101, thread $\alpha$—the producer—writes data. At 1102 thread $\alpha$ requests a generation increment pursuant to a producer generation change sync. At 1103 thread $\alpha$ monitors the generation counter until it increments. When the generation increments, it sets the data ready flag.
  At 1105 thread $\beta$—the consumer—tests whether the ready flag is set. At 1106, thread $\beta$ also tests, in accordance with a consumer sync, whether the reclaim pointer has reached the generation of the current synchronization request. When both conditions are met at 1107, then thread $\beta$ can use the data at 1108.
  In addition to the standard addressing and data functions 454, 455, when the L1P 58—shown in FIG. 14—sees any of these synchronization requests at the interface from the core 52, it immediately stops write combining—responsive to the decode function 457 and the control unit 452—for all currently open write combining buffers 450 and enqueues the request in its request queue 451. During the lookup phase of the request, synchronizing requests will advantageously request an increment of the generation counter and wait until the last generation completes, executing a Full Sync. The L1P will then resume the lookup and notify the core 52 of its completion.
  To invoke the synchronizing behavior of synchronization types other than full sync, at least two implementation options are possible:
  1. synchronization caused by load and store operations to predefined addresses
    Synchronization levels are controlled by memory-mapped I/O accesses. As store operations can bypass load operations, synchronization operations that require preceding loads to have completed are implemented as load operations to memory mapped I/O space, followed by a conditional branch that depends on the load return value. Simple use of load return may be sufficient. If the sync does not depend on the completion of preceding loads, it can be implemented as store to memory mapped I/O space. Some implementation issues of one embodiment are as follows. A write access to this location is mapped to a sync request which is sent to the memory synchronization unit. The write request stalls the further processing of requests until the sync completes. A load request to the location causes the same type of requests, but only the full and the consumer request stall. All other load requests return the completion status as value back, a 0 for sync not yet complete, a 1 for sync complete. This implementation does not take advantage all of the built in PowerPC constraints of a core implementing PowerPC architecture. Accordingly, more programmer attention to order of memory access requests is needed.

2. configuring the semantics of the next synchronizations instruction, e.g. the PowerPC msync, via storing to a memory mapped configuration register In this implementation, before every memory synchronization instruction, a store is executed that deposits a value that selects a synchronization behavior into a memory mapped register. The next executed memory synchronization instruction invokes the selected behavior and restores the configuration back to the Full Sync behavior. This reactivation of the strongest synchronization type guarantees correct execution if applications or subroutines that do not program the configuration register are executed.

Memory Synchronization Interface Unit

FIG. 9 illustrates operation of the memory synchronization interface unit 904 associated with a prefetch unit group 58 of each processor 52. This unit mediates between the OR reduce end-point, the global generation counter unit and the synchronization requesting unit. The memory synchronization interface unit 904 includes a control unit 906 that collects and aggregates requests from one or more clients 901 (e.g., 4 thread memory synchronization controls of the L1P via decoder 902) and requests generation increments from the global generation counter unit 905 illustrated in FIG. 6 and receives current counts from that unit as well. The control unit 906 includes a respective set of registers 907 for each hardware thread. These registers may store information such as configuration for a current memory synchronization instruction issued by a core 52, when the currently operating memory synchronization instruction started, whether data has been sent to the central unit, and whether a generation change has been received.

The register storing configuration will sometimes be referred to herein as "configuration register." This control unit 906 notifies the core 52 via 908 when the msync is completed. The core issuing the msync drains all loads and stored, stops taking loads and stores and stops the issuing thread until the msync completion indication is received.

This control unit also exchanges information with the global generation counter module 905. This information includes a generation count. In the present embodiment, there is only one input per L1P to the generation counter, so the L1P aggregates requests for increment from all hardware threads of the processor 52. Also, in the present embodiment, the OR reduce tree is coupled to the reclaim pointer, so the memory synchronization interface unit gets information from the OR reduce tree indirectly via the reclaim pointer.

The control unit also tracks the changes of the global generation (gen_cnt) and determines whether a request of a client has completed. Generation completion is detected by using the reclaim pointer that is fed to observer latches in the L1P. The core waits for the L1P to handle the msyncs. Each hardware thread may be waiting for a different generation to complete. Therefore each one stores what the generation for that current memory synchronization instruction was. Each then waits individually for its respective generation to complete.

Figure 10:
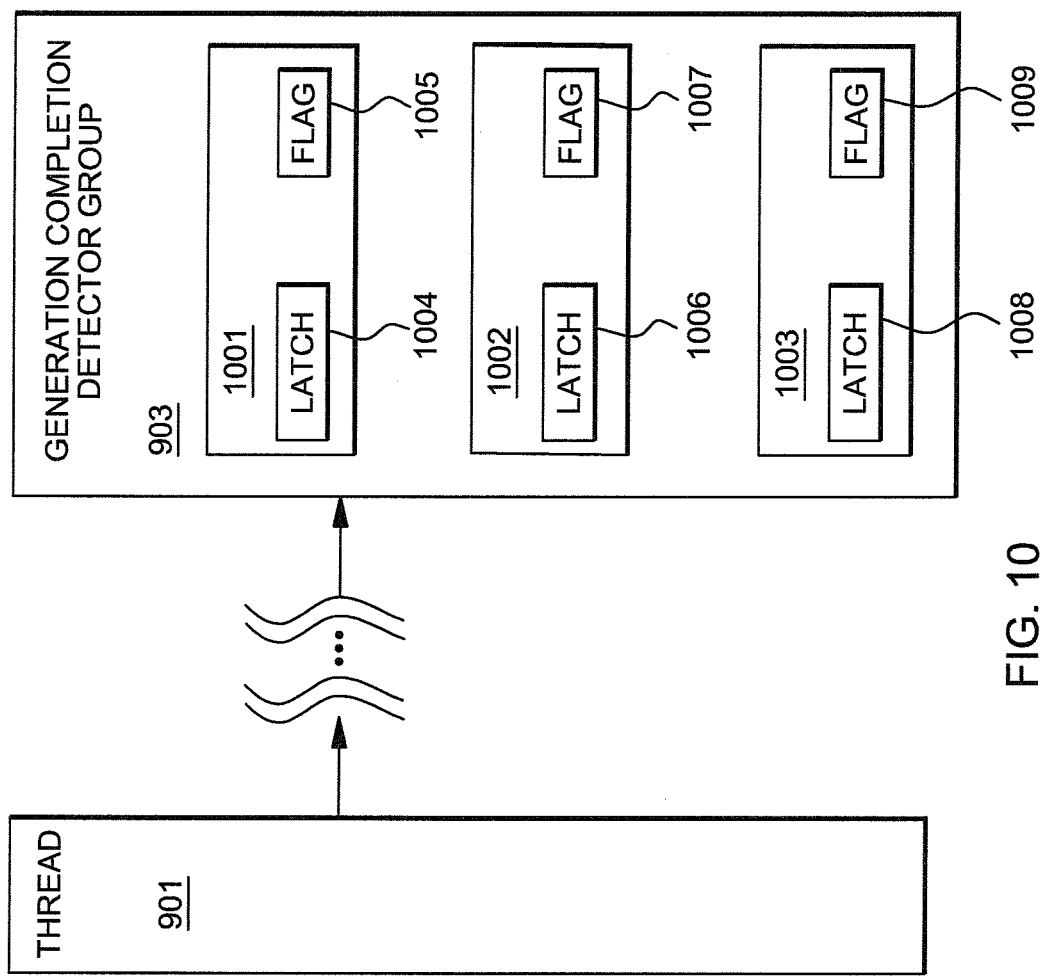
FIG. 10 is a conceptual diagram showing a detector from the memory synchronization interface.

For each client 901, the unit implements a group 903 of three generation completion detectors shown at 1001, 1002, 1003, per FIG. 10. Each detector implements a 3 bit latch 1004, 1006, 1008 that stores a generation to track, which will sometimes be the current generation, gen_cnt, and sometimes be the prior generation, last_gen. Each detector also implements a flag 1005, 1007, 1009 that indicates if the generation tracked has still requests in flight (ginfl_flag). The detectors can have additional flags, for instance to show that multiple generations have completed.

For each store request generated by a client, the first 1001 of the three detectors sets its ginfl_flag 1005 and updates the last_gen latch 1004 with the current generation. This detector is updated for every store, and therefore reflects whether the last store has completed or not. This is sufficient, since prior stores will have generations less than or equal to the generation of the current store. Also, since the core is waiting for memory synchronization, it will not be making more stores until the completion indication is received.

For each memory access request, regardless whether load or store, the second detector 1002 is set correspondingly. This detector is updated for every load and every store, and therefore its flag indicates whether the last memory access request has completed.

If a client requests a full sync, the third detector 1003 is primed with the current generation, and for a consumer sync the third detector is primed with the current generation-1. Again, this detector is updated for every full or consumer sync.

Since the reclaim pointer cannot advance without everything in that generation having completed and because the reclaim pointer cannot pass the generation counter, the reclaim pointer is an indication of whether a generation has completed. If the rcl_ptr 602 moves past the generation stored in last gen, no requests for the generation are in flight anymore and the ginfl_flag is cleared.

Full Sync

This sync completes if the ginfl_flag 1009 of the third detector 1003 is cleared. Until completion, it requests a generation change to the value stored in the third detector plus one.

Non-Cumulative Barrier

This sync completes if the ginfl_flag 1007 of the second detector 1002 is cleared. Until completion, it requests a generation change to the value that is held in the second detector plus one.

Producer Sync

This sync completes if the ginfl_flag 1005 of the first detector 1001 is cleared. Until completion, it requests a generation change to the value held in the first detector plus one.

Generation Change Sync

This sync completes if either the ginfl_flag 1007 of the second detector 1002 is cleared or the if the last_gen 1006 of the second detector is different from gen_cnt 601. If it does not complete immediately, it requests a generation change to the value stored in the second detector plus one. The purpose of the operation is to advance the current generation (value of gen_cnt) to at least one higher than the generation of the last load or store. The generation of the last load or store is stored in the last_gen register of the second detector.

1) If the current generation equals the one of the last load/store, the current generation is advanced (exception is 3) below).

2) If the current generation is not equal to the one of the last load/store, it must have incremented at least once since the last load/store and that is sufficient;

3) There is a case when the generation counter has wrapped and now points again at the generation value of the last load/store. This case is distinguished from 1) by the cleared ginfl_flag (when we have wrapped, the original generation is no longer in flight). In this case, we are done as well, as we have incremented at least 8 times since the last load/store (wrap every 8 increments)

Producer Generation Change Sync

This sync completes if either the ginfl_flag 1005 of the first detector 1001 is cleared or if the last_gen 1004 of the first detector is different from gen_cnt 601. If it does not complete immediately, it requests a generation change to of the value stored in the first detector plus one. This operates similarly to the generation change sync except that it uses the generation of the last store, rather than load or store.

Consumer Sync

This sync completes if the ginfl_flag 1009 of the third detector 1003 is cleared. Until completion, it requests a generation change to of the value stored in the third detector plus one.

Local Barrier

This sync is executed by the L1P, it does not involve generation tracking.

From the above discussion, it can be seen that a memory synchronization instruction actually implicates a set of sub-tasks. For a comprehensive memory synchronization scheme, those sub-tasks might include one or more of the following:

Requesting a generation change between memory access requests;

Checking a given one of a group of possible generation indications in accordance with a desired level of synchronization strength;

Waiting for a change in the given one before allowing a next memory access request; and Waiting for some other event.

In implementing the various levels of synchronization herein, sub-sets of this set of sub-tasks can be viewed as partial synchronization tasks to be allocated between threads in an effort to improve throughput of the system. Therefore address formats of instructions specifying a synchronization level effectively act as parameters to offload sub-tasks from or to the thread containing the synchronization instruction. If a particular sub-task implicated by the memory synchronization instruction is not performed by the thread containing the memory synchronization instruction, then the implication is that some other thread will pick up that part of the memory synchronization function. While particular levels of synchronization are specified herein, the general concept of distributing synchronization sub-tasks between threads is not limited to any particular instruction type or set of levels.

Physical Design

The Global OR tree needs attention to layout and pipelining, as its latency affects the performance of the sync operations.

In the current embodiment, the cycle time is 1.25 ns. In that time, a signal will travel 2 mm through a wire. Where a wire is longer than 2 mm, the delay will exceed one clock cycle, potentially causing unpredictable behavior in the transmission of signals. To prevent this, a latch should be placed at each position on each wire that corresponds to 1.25 ns, in other words approximately every 2 mm. This means that every transmission distance delay of 4 ns will be increased to 5 ns, but the circuit behavior will be more predictable. In the case of the msync unit, some of the wires are expected to be on the order of 10 mm meaning that they should have on the order of five latches.

Due to quantum mechanical effects, it is advisable to protect latches holding generation information with Error Correcting Codes ("ECC") (4b per 3b counter data). All operations may include ECC correction and ECC regeneration logic.

The global broadcast and generation change interfaces may be protected by parity. In the case of a single cycle upset, the request or counter value transmitted is ignored, which does not affect correctness of the logic.

Software Interface

The Msync unit will implement the ordering semantics of the PPC hwsync, lwsync and mbar instruction by mapping these operations to the full sync.

Figure 13:
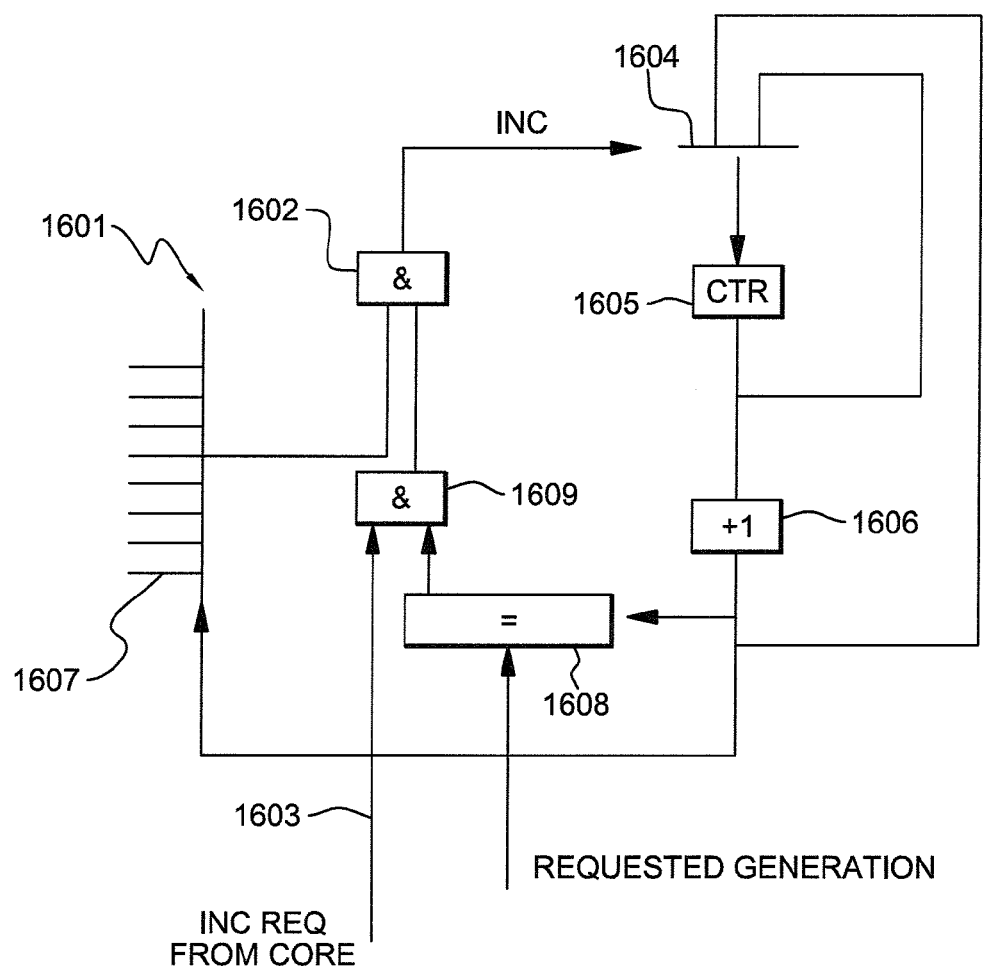
FIG. 13 shows a delay circuit.

FIG. 13 shows a mechanism for delaying incrementation if too many generations are in flight. At 1601, the outputs of the OR reduce tree are multiplexed, to yield a positive result if all possible generations are in flight. A counter 1605 holds the current generation, which is incremented at 1606. A comparator 1609 compares the current generation plus one to the requested generation. A comparison result is ANDed at 1609 with an increment request from the core. A result from the AND at 1609 is ANDed at 1602 with an output of multiplexer 1601.

Although the embodiments of the present invention have been described in detail, it should be understood that various changes and substitutions can be made therein without departing from spirit and scope of the inventions as defined by the appended claims. Variations described for the present invention can be realized in any combination desirable for each particular application. Thus particular limitations, and/or embodiment enhancements described herein, which may have particular advantages to a particular application need not be used for all applications. Also, not all limitations need be implemented in methods, systems and/or apparatus including one or more concepts of the present invention.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The word "comprising", "comprise", or "comprises" as used herein should not be viewed as excluding additional elements. The singular article "a" or "an" as used herein should not be viewed as excluding a plurality of elements. Unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Ordinal terms in the claims, such as "first" and "second" are used for distinguishing elements and do not necessarily imply order of operation.

The invention claimed is:

1. A method for memory synchronization for use in a multiprocessor system having a plurality of processors and a memory device coupled to the processors, the method comprising:
receiving, at a memory unit associated with a processor, one or more memory access requests from one or more processors;
broadcasting a central generation indication from a memory synchronization unit; and
at each memory unit:
tagging each memory access request with bits representing a global generation number responsive to the central generation indication;
OR-ing said tagged bits from each memory access request to determine what generations are in flight and generating a vector representing generations in flight; and
supplying said generated vector to a global OR reduce tree; and
aggregating, at said global OR reduce tree, information from said generated vectors from each said memory unit about current generations of memory requests in flight; and
delaying memory access requests responsive to said information aggregated at said global OR reduce tree.

2. The method of claim 1, wherein
the central generation indication comprises a pointer value and
the operations comprise,
holding incrementation of the pointer value so long as a given generation is in flight; and
when given generations in flight are completed, incrementing the pointer value.

3. The method of claim 1, wherein the central indication comprises a first count indicating a generation and a second count indicating a reclaim pointer.

4. The method of claim 3, comprising preventing the first and second count from passing each other.

5. A central memory synchronization module for use in a multiprocessor system, the system comprising a plurality of processors and a memory device coupled to the processors, the module comprising
at least one global generation bit counter configured to issue a global numeric generation indication;
a plurality of memory units, each memory unit configured to:
receive and store memory access requests from said processors;
tag each memory access request with bits representing a global generation number responsive to the global numeric generation indication;
apply OR-ing logic to said tagged bits from each memory access request to determine what generations are in flight and generate a vector representing generations in flight for the memory unit; and
supplying said generated vector from each memory unit to
at least one global OR reduce tree, said global OR reduce tree for aggregating information from said generated vectors from each said memory unit about current generations of memory requests in flight; and
at least one broadcast facility for broadcasting the generation indication and a result derived from the OR reduce tree.

6. The module of claim 5,
wherein the global generation
bit counter defines a current generation of memory access; said module further comprising:
a reclaim pointer for pointing to an oldest generation in flight; and said module further comprising:
at least one broadcast interface for providing a value of the counter and the reclaim pointer to the system; and
a request interface for coupling within the system and receiving synchronization requests.

7. The module of claim 5, wherein the at least one global OR reduce tree is configured to:
receive a plurality of respective vectors—each respective vector having a respective bit for each possible generation, indicating whether there are memory accesses in flight for that generation—from each unit capable of requesting memory access; and
apply OR-ing logic to the respective vectors to determine whether there are memory access requests in flight for any generation.

8. The module of claim 5, wherein the multiprocessor system further comprises:
at least one synchronization controller unit configured to couple with a synchronization requesting processor and an OR reduce tree end-point, and a plurality of respective generation detectors for tracking a current generation associated with a requesting processor.

* * * * *